(12) United States Patent
Minich

(10) Patent No.: US 10,164,361 B2
(45) Date of Patent: Dec. 25, 2018

(54) SEPARATOR FOR ELECTRICAL ASSEMBLY

(71) Applicant: FCI USA LLC, Etters, PA (US)

(72) Inventor: Steven E. Minich, York, PA (US)

(73) Assignee: FCI USA LLC, Etters, PA (US)

( * ) Notice: Subject to any disclaimer, the term of this patent is extended or adjusted under 35 U.S.C. 154(b) by 0 days.

(21) Appl. No.: 15/543,850

(22) PCT Filed: Jan. 13, 2016

(86) PCT No.: PCT/US2016/013161
§ 371 (c)(1),
(2) Date: Jul. 14, 2017

(87) PCT Pub. No.: WO2016/115205
PCT Pub. Date: Jul. 21, 2016

(65) Prior Publication Data
US 2018/0269608 A1     Sep. 20, 2018

Related U.S. Application Data

(60) Provisional application No. 62/104,057, filed on Jan. 15, 2015.

(51) Int. Cl.
*H01R 12/00* (2006.01)
*H01R 12/71* (2011.01)
(Continued)

(52) U.S. Cl.
CPC ........... *H01R 12/716* (2013.01); *H05K 1/144* (2013.01); *H05K 3/3457* (2013.01);
(Continued)

(58) Field of Classification Search
CPC .... H01R 12/716; H01R 12/52; H01R 12/714; H01R 13/20; H01R 12/523; H01R 13/6315; H01R 13/24; H01R 13/6587; H01R 13/6594; H05K 1/144; H05K 3/3457; H05K 2201/042; H05K 2203/041
See application file for complete search history.

(56) References Cited

U.S. PATENT DOCUMENTS 7,052,288 B1 * 5/2006 Minich ................ H01R 12/585
174/266
9,385,487 B2 * 7/2016 Wu ......................... H01R 12/73
(Continued)

FOREIGN PATENT DOCUMENTS

JP     2013-026040 A     2/2013

OTHER PUBLICATIONS

International Search Report and Written Opinion for International Application No. PCT/US2016/013161 dated Apr. 29, 2016.
(Continued)

*Primary Examiner* — Xuong Chung Trans
(74) *Attorney, Agent, or Firm* — Wolf, Greenfield & Sacks, P.C.

(57) ABSTRACT

A separator is configured to separate first and second printed circuit boards that are in electrical communication with each other through first and second pluralities of electrical connectors that are mounted to the first and second substrates, respectively, and mated to each other.

28 Claims, 15 Drawing Sheets

(51) Int. Cl.
*H05K 1/14* (2006.01)
*H05K 3/34* (2006.01)
(52) U.S. Cl.
CPC .................. *H05K 2201/042* (2013.01); *H05K 2201/10189* (2013.01); *H05K 2203/041* (2013.01)

(56) References Cited

U.S. PATENT DOCUMENTS

| | | |
|---|---|---|
| 9,543,703 B2 * | 1/2017 | Horchler ................ H01R 13/64 |
| 9,728,872 B2 * | 8/2017 | Sun ....................... H01R 12/716 |
| 9,871,323 B2 * | 1/2018 | Horchler ................ H01R 13/64 |
| 2004/0023524 A1 | 2/2004 | Ashman et al. |
| 2004/0121626 A1 | 6/2004 | Belopolsky |
| 2009/0170351 A1 | 7/2009 | Minich |
| 2012/0252274 A1 | 10/2012 | Ju |

OTHER PUBLICATIONS

International Preliminary Report on Patentability for International Application No. PCT/US2016/013161 dated Jul. 27, 2017.

\* cited by examiner

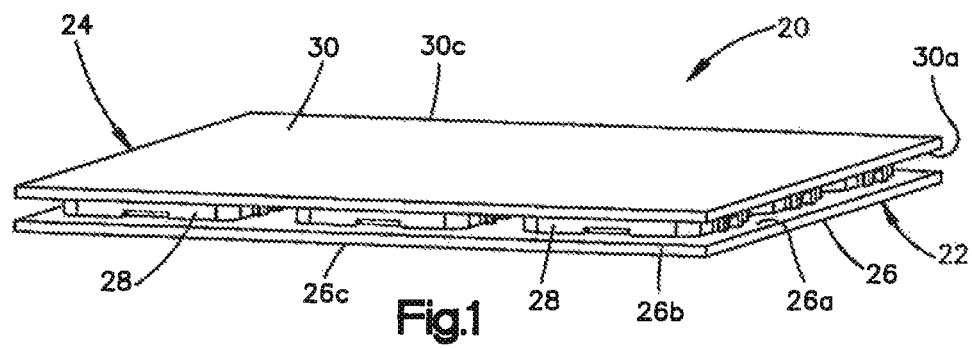
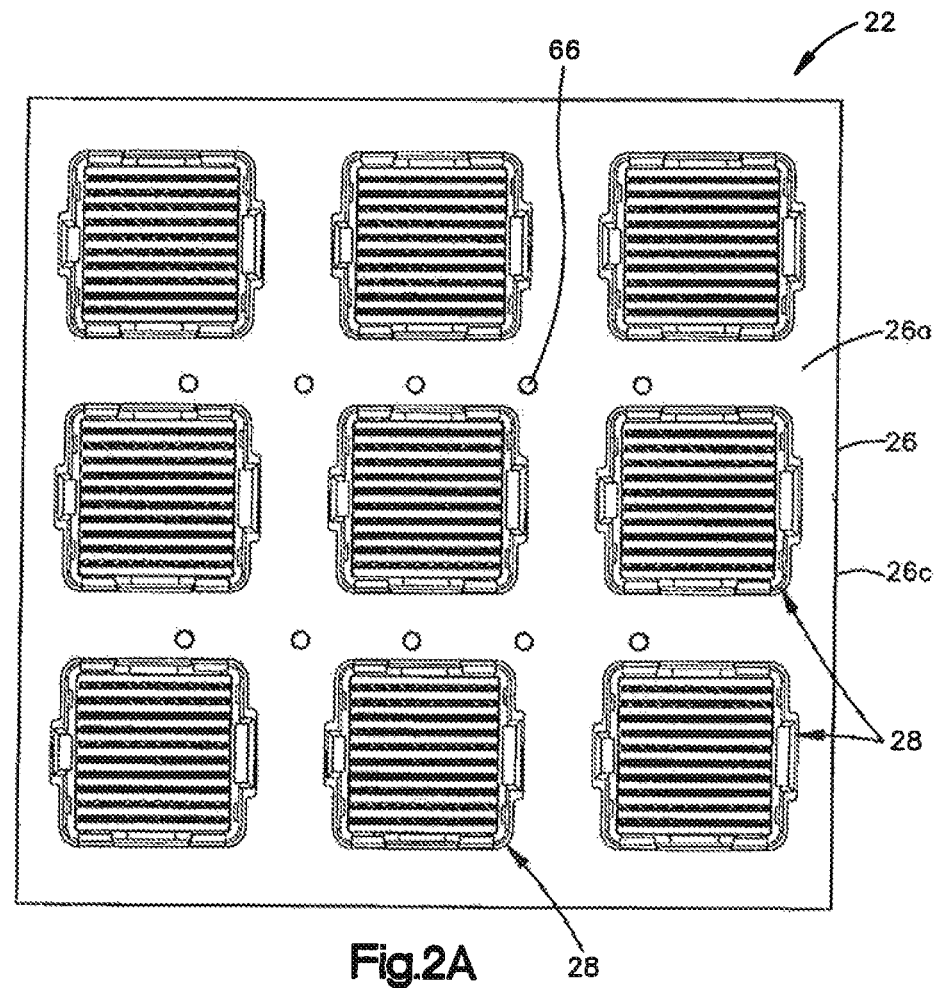

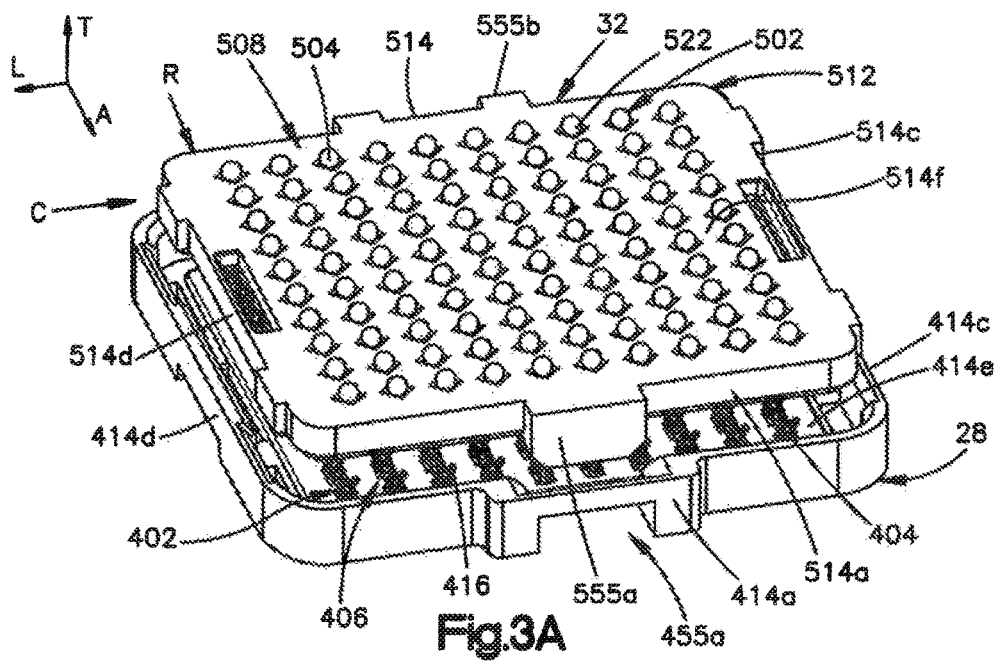
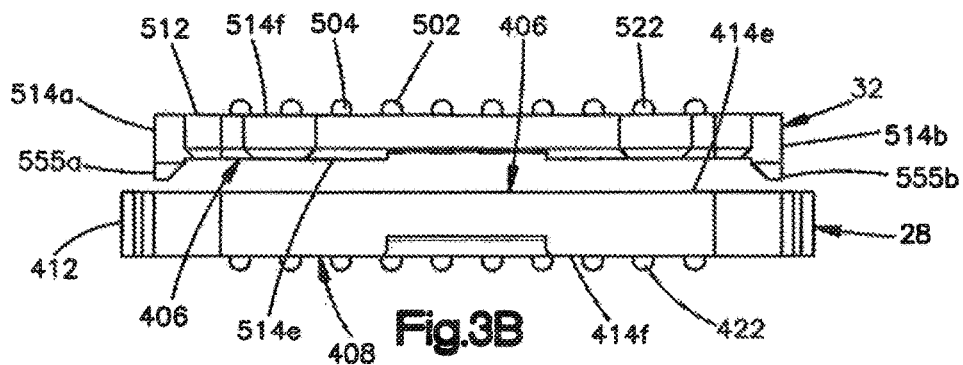
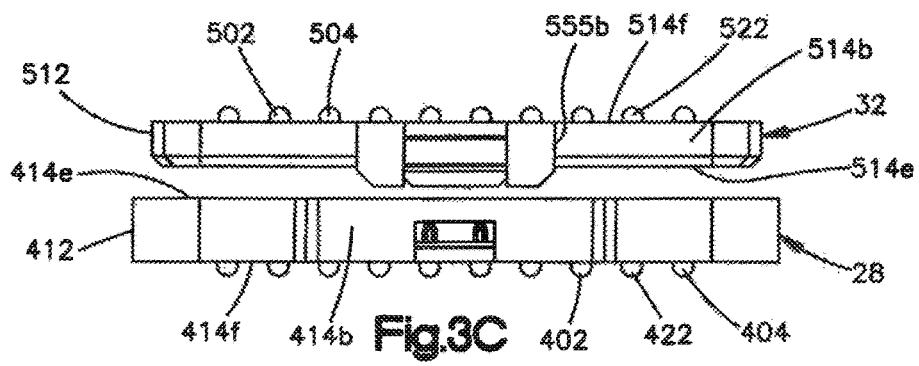

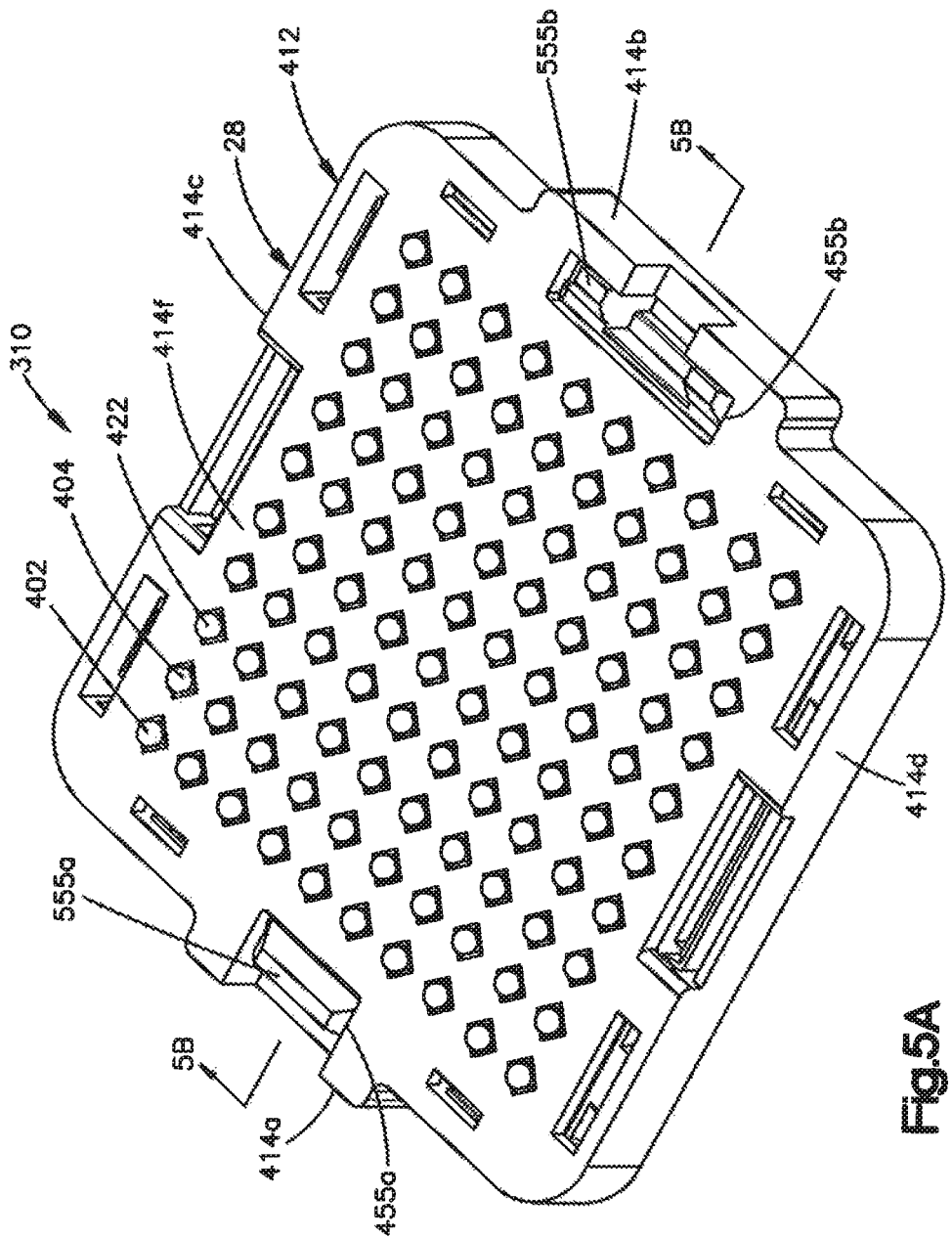

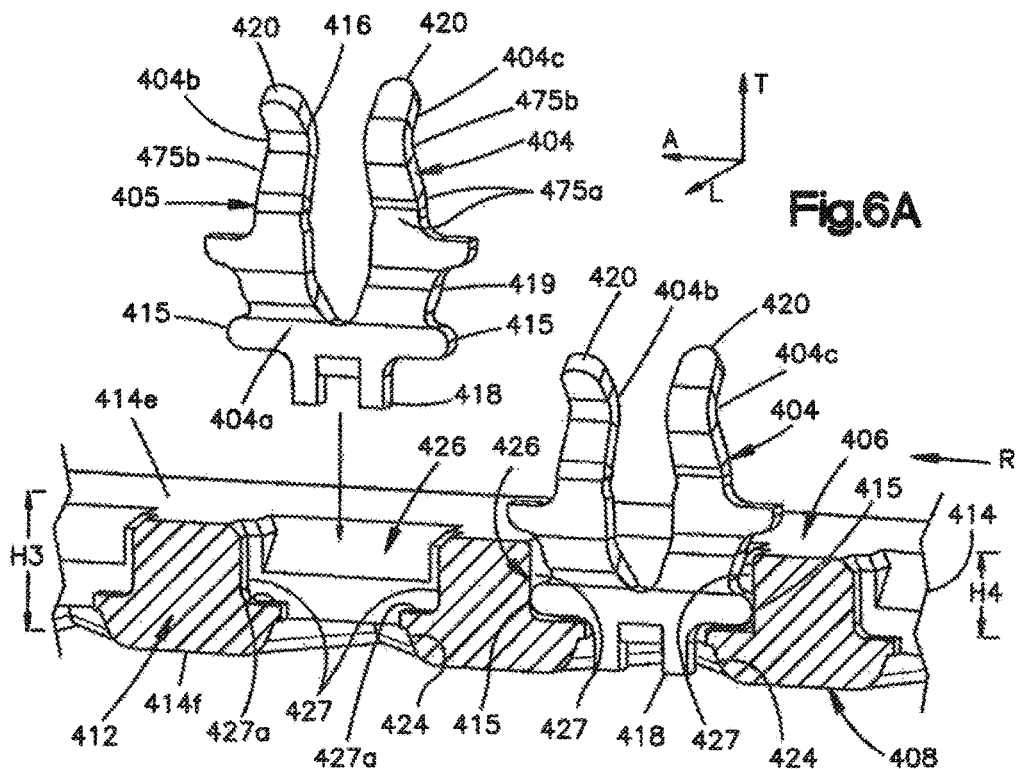
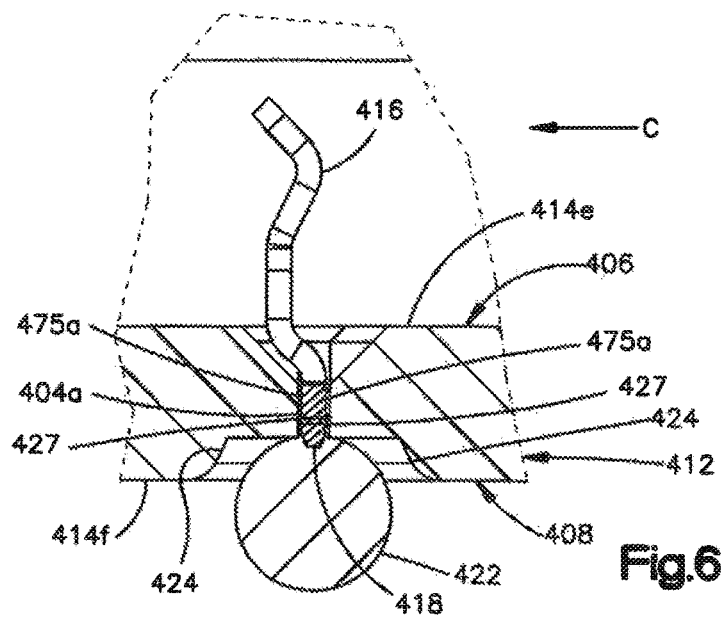

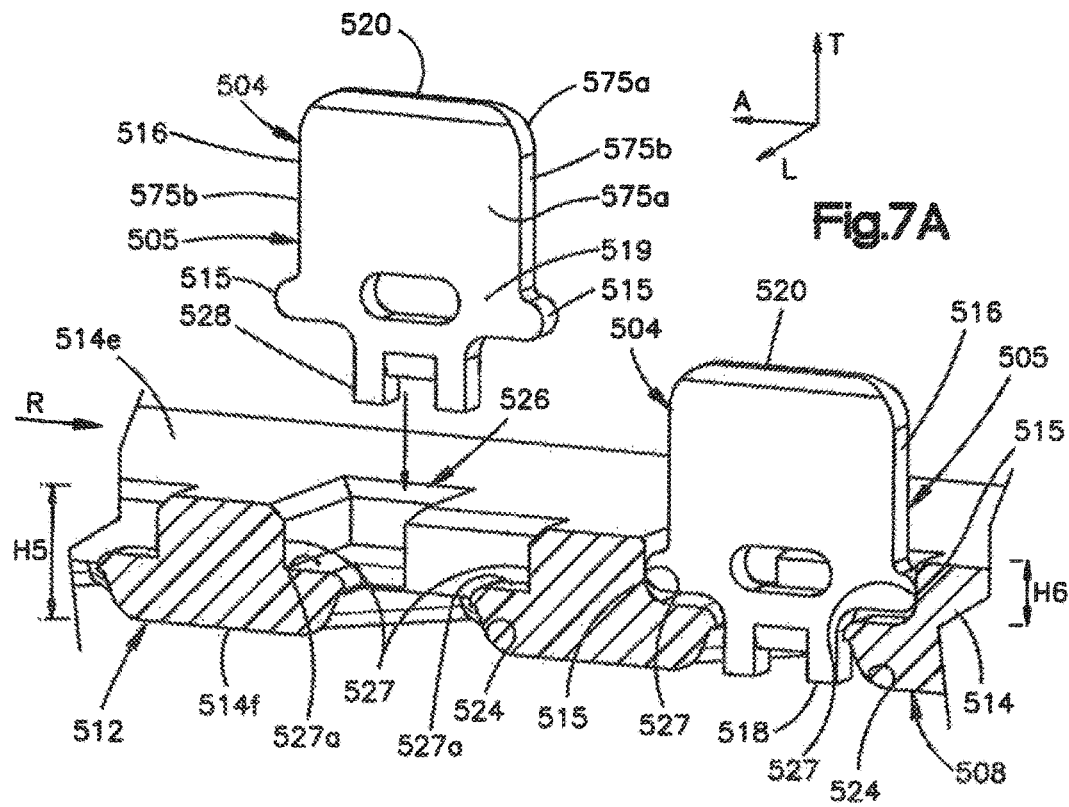
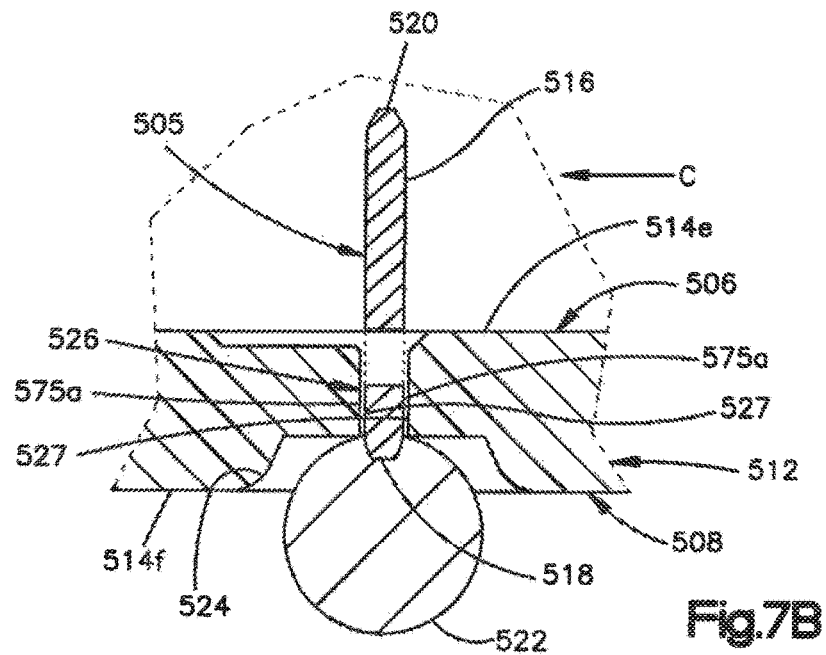

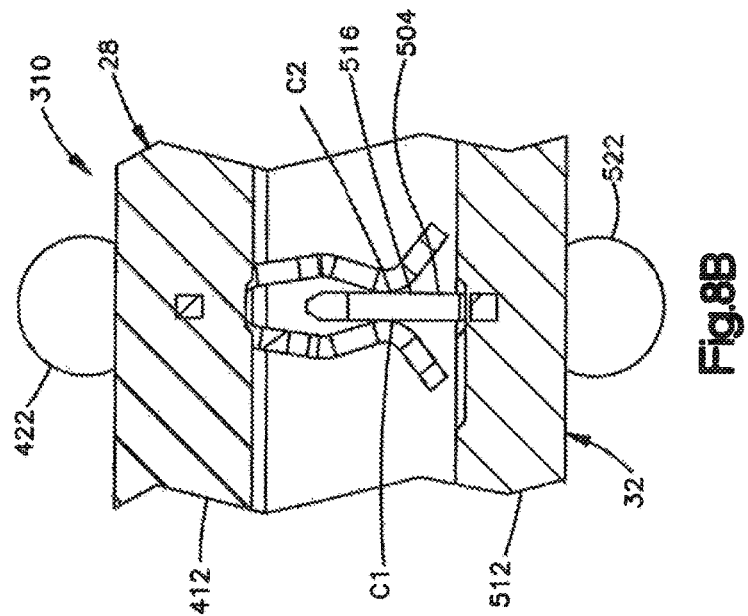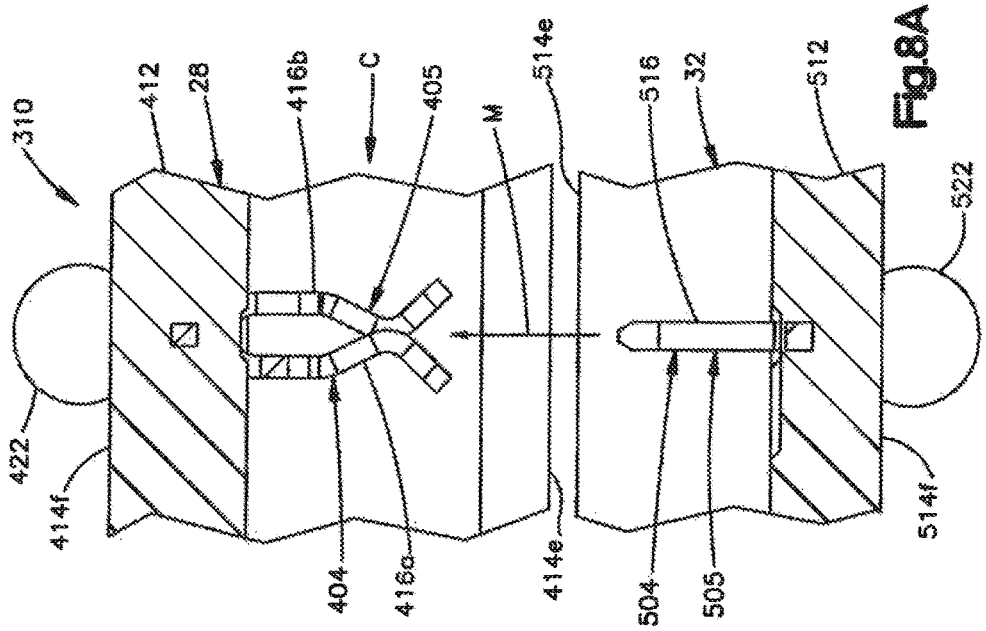

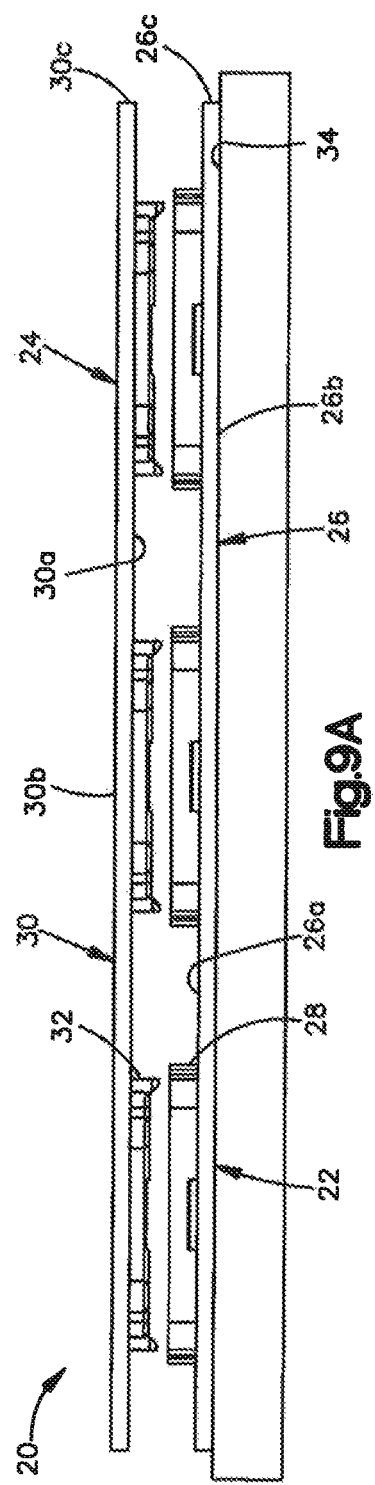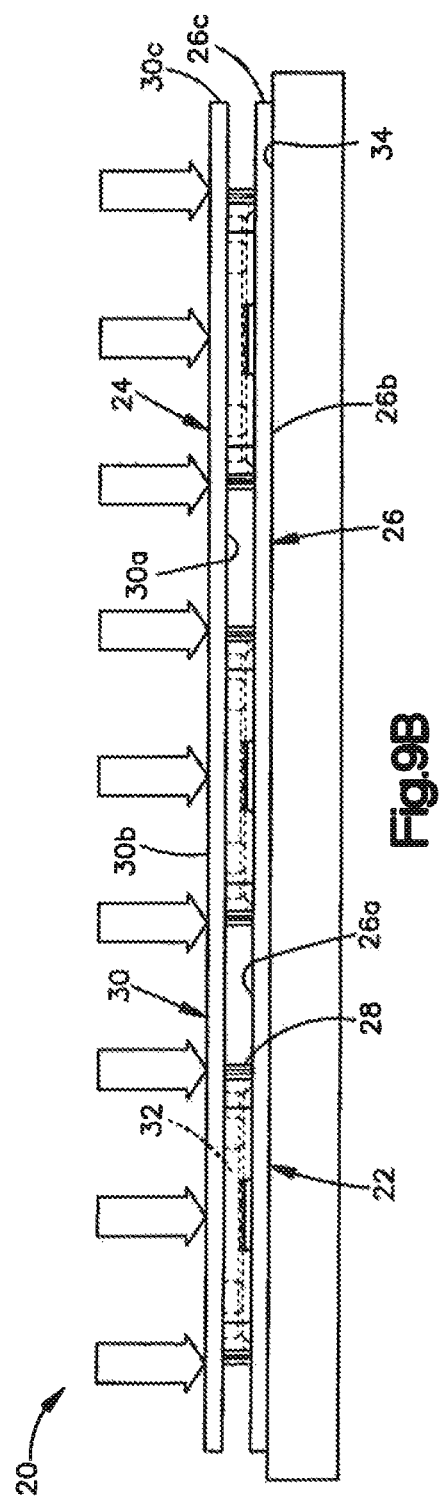

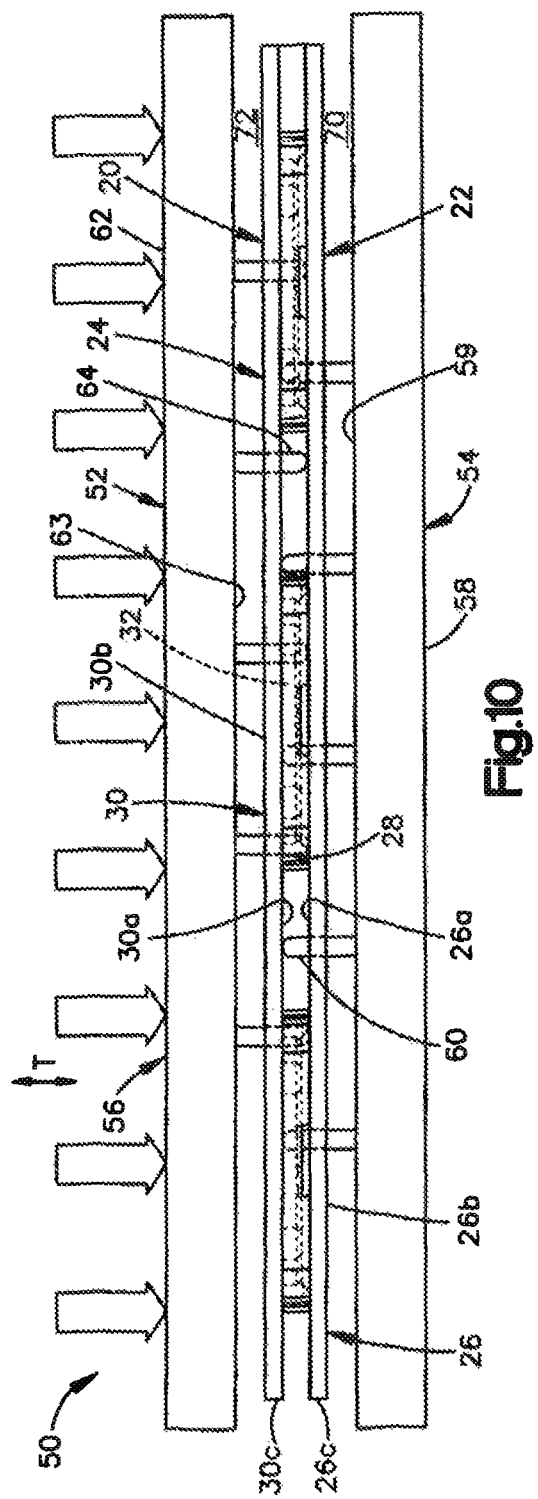

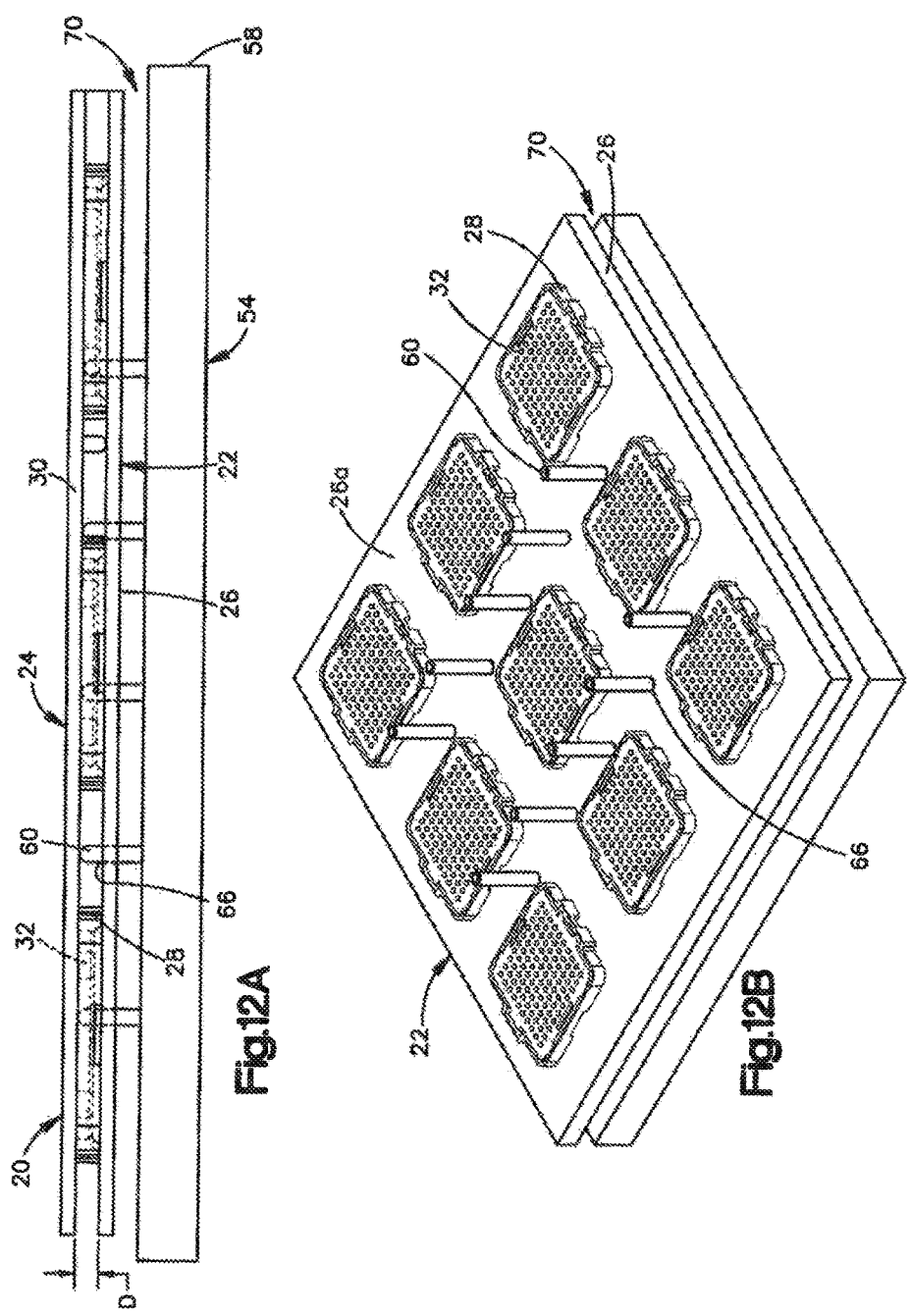

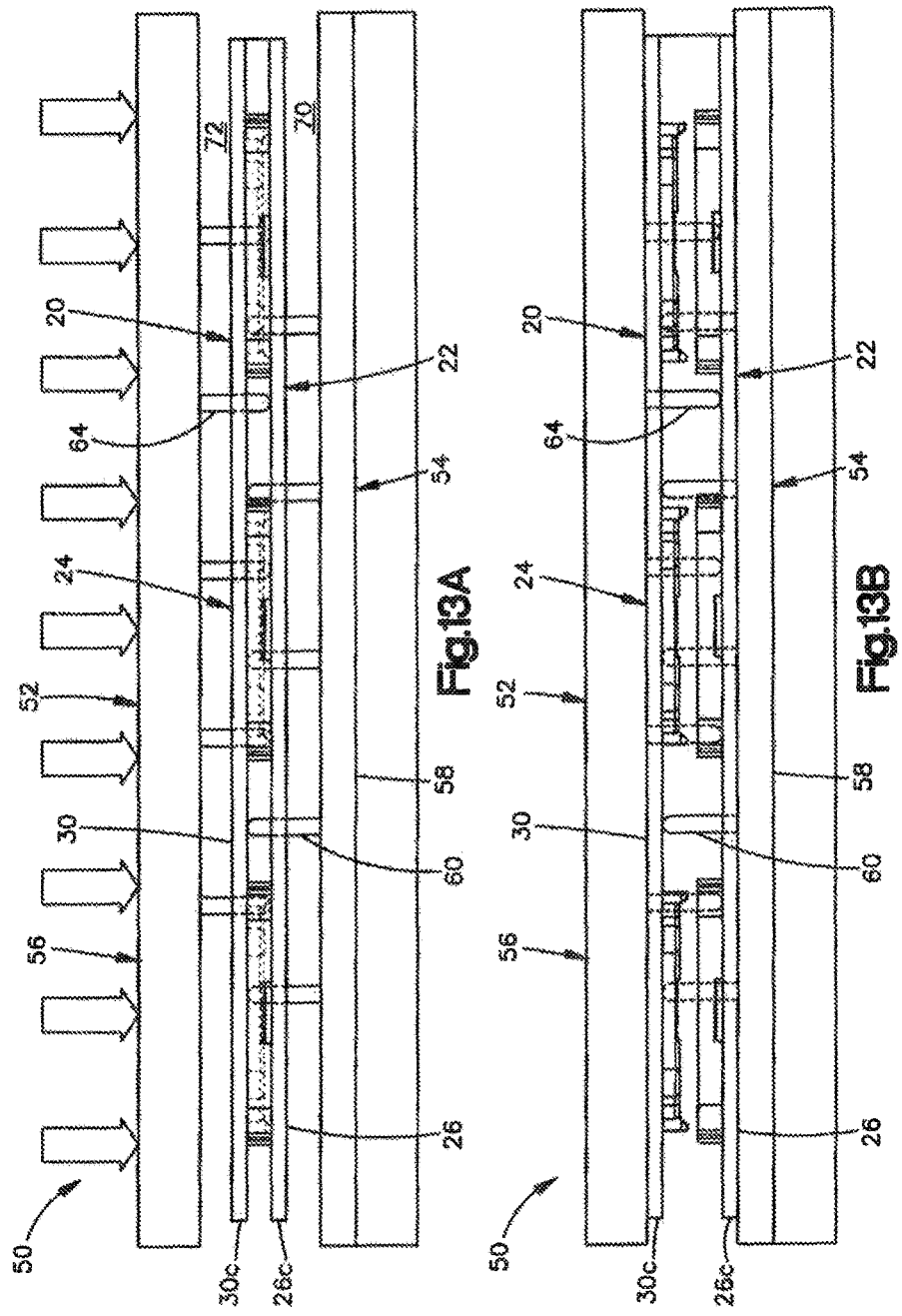

SEPARATOR FOR ELECTRICAL ASSEMBLY

RELATED APPLICATIONS

This application is the U.S. National Stage of and claims priority to and the benefit of International Patent Application Number PCT/US2016/013161, entitled "SEPARATOR FOR ELECTRICAL ASSEMBLY" filed on Jan. 13, 2016, which claims priority under 35 U.S.C. § 119(e) to U.S. Provisional Application Ser. No. 62/104,057, entitled "SEPARATOR FOR ELECTRICAL ASSEMBLY" filed on Jan. 15, 2015, which is herein incorporated by reference in its entirety. The entire contents of these applications are incorporated herein by reference in their entirety.

BACKGROUND

Electrical connectors are configured to transfer electrical signals between complementary electrical components. In one assembly, a plurality of first electrical connectors are mounted onto a first printed circuit board thereby placing the first electrical connectors in electrical communication with the first printed circuit hoard, and a plurality of second electrical connectors are mounted onto a second printed circuit board thereby placing the second electrical connectors in electrical communication with the second printed circuit board. The first electrical connectors are then mated to respective ones of the second plurality of electrical connectors to thereby place the first and second printed circuit boards in electrical communication with each other through respective ones of the mated first and second electrical connectors.

To mate the first and electrical connectors with each other, the first electrical connectors are aligned with respective ones of the second electrical connectors. One of the first and second printed circuit boards is placed on a support surface, and a distributed force is applied to the other of the first and second printed circuit boards toward the one of the first and second printed circuit boards. The distributed force creates a compressive force that brings the first and second printed circuit boards toward each other, thereby causing the respective pluralities of first and second electrical connectors to mate with each other.

What is desired is a method and apparatus for causing the pluralities of first and second electrical connectors to unmate from each other, without applying undo stress on the printed circuit boards and connectors.

SUMMARY

In accordance with one aspect of the present disclosure, a separator is configured to separate first and second electrical sub-assemblies that include first and second substrates, respectively, and respective pluralities of first and second electrical connectors that are mounted to the first and second substrates, respectively, and mated to each other. The separator can include a first separation member having a plurality of first separation posts that are sized and configured extend through respective ones of a first plurality of apertures that extend through the first printed circuit board. The separator can further include a second separation member having a plurality of second separation posts that are sized and configured to extend through respective ones of a second plurality of apertures that extend through the second printed circuit board. When either the first separation posts are in mechanical communication with the second substrate and/or the second separation posts are in mechanical communication with the first substrate, at least one of the first and second separation members is configured to receive a compressive force toward the other one of the first and second separation members sufficient to cause the first and second substrates to separate from each other.

BRIEF DESCRIPTION OF THE DRAWINGS

The foregoing summary, as well as the following detailed description of example embodiments of the application, will be better understood when read in conjunction with the appended drawings, in which there is shown in the drawings example embodiments for the purposes of illustration. It should be understood, however, that the application is not limited to the precise arrangements and instrumentalities shown. In the drawings:

FIG. 1 is a schematic perspective view of an electrical assembly constructed in accordance with one embodiment, including a first electrical sub-assembly and a second electrical sub-assembly mated with the first electrical sub-assembly;

FIG. 2A is a schematic plan view of the first electrical sub-assembly illustrated in FIG. 1;

FIG. 3A is a perspective view of a first and second electrical connectors of the first and second electrical sub-assemblies, respectively, illustrated in FIG. 1 aligned to be mated with each other;

FIG. 3B is a side elevation view of the first and second electrical connectors illustrated in FIG. 3A;

FIG. 3C is another side elevation view of the first and second electrical connectors illustrated in FIG. 3A;

FIG. 5A is a perspective view of the first and second electrical connectors illustrated in FIG. 3A, shown mated with each other;

FIG. 6A is a partially exploded sectional perspective view of a portion of the first electrical connector illustrated in FIG. 3A, showing one of the electrical contacts being inserted into the connector housing, and showing another one of the electrical contacts inserted in the connector housing;

FIG. 6B is a sectional side elevation view of a portion of the first electrical connector illustrated in FIG. 6A, showing the electrical contacts inserted in the connector housing;

FIG. 7A is a partially exploded sectional perspective view of a portion of the second electrical connector illustrated in FIG. 3A, showing one of the electrical contacts being inserted into the connector housing, and showing another one of the electrical contacts inserted in the connector housing;

FIG. 7B is a sectional side elevation view of a portion of the second electrical connector illustrated in FIG. 7A, showing the electrical contacts inserted in the connector housing;

FIG. 8A is a side elevation view of the electrical contacts of the first electrical connector aligned to be mated with the electrical contacts of the second electrical connector;

FIG. 8B is a side elevation view of the electrical contacts illustrated in FIG. 8A shown mated to each other;

FIG. 9A is a schematic side elevation view of the electrical assembly illustrated in FIG. 1, showing the first and second electrical sub-assemblies aligned to be mated with each other;

FIG. 9B is a schematic side elevation view of the electrical assembly illustrated in FIG. 9A, showing application of a mating force to the first and second electrical sub-assemblies;

FIG. 10 is a schematic side elevation view of an electrical system including the electrical assembly illustrated in FIG. 1, and a separator configured to separate the first and second electrical sub-assemblies;

FIG. 12A is a schematic side elevation view of a portion of the electrical system illustrated in FIG. 10; showing the first separation member installed in the electrical assembly;

FIG. 12B is a schematic perspective view of the electrical system illustrated in FIG. 10, but with the second separation member and the second electrical sub-assembly removed for illustrative purposes;

FIG. 13A is a schematic side elevation view of the electrical system illustrated in FIG. 10, showing application of a separation force to the separator; and FIG. 13B is a schematic side elevation view of the electrical system illustrated in FIG. 13A, showing the first and second electrical sub-assemblies separated from each other.

DETAILED DESCRIPTION

Figure 2B:
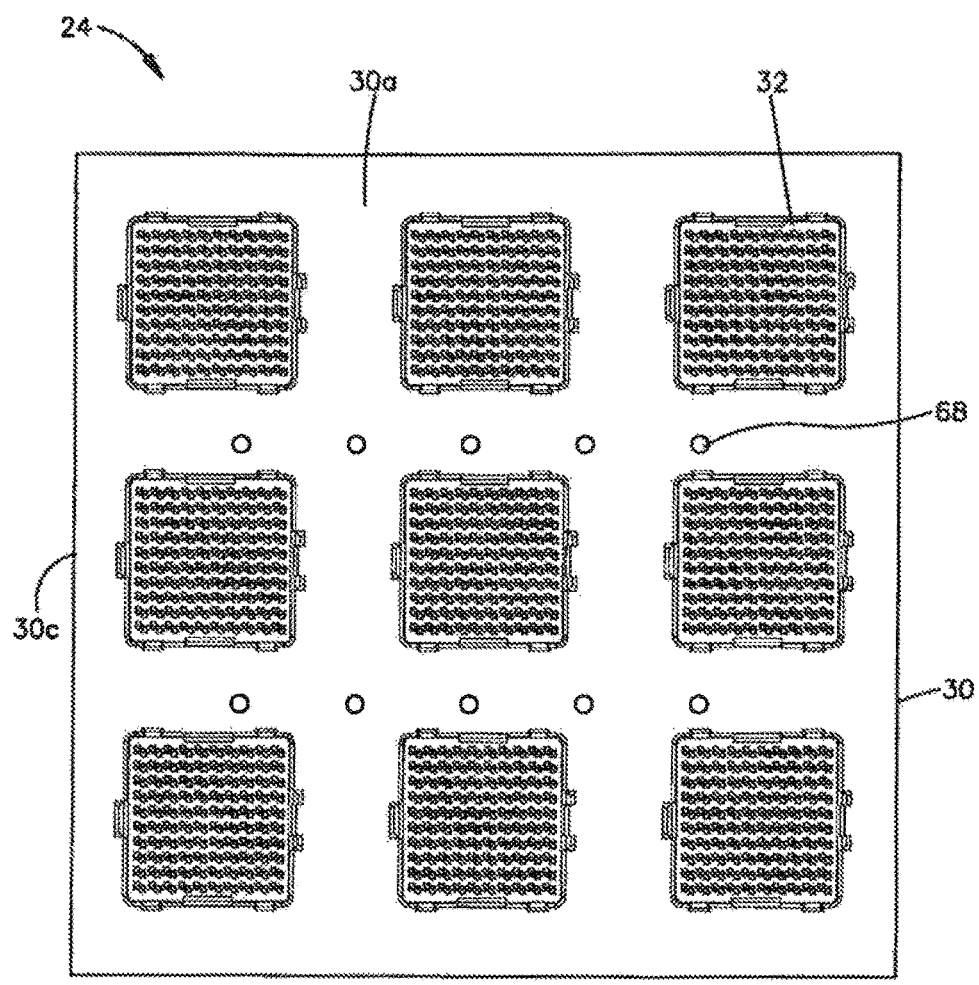
FIG. 2B is a schematic plan view of the second electrical sub-assembly illustrated in FIG. 1.
Figure 4A:
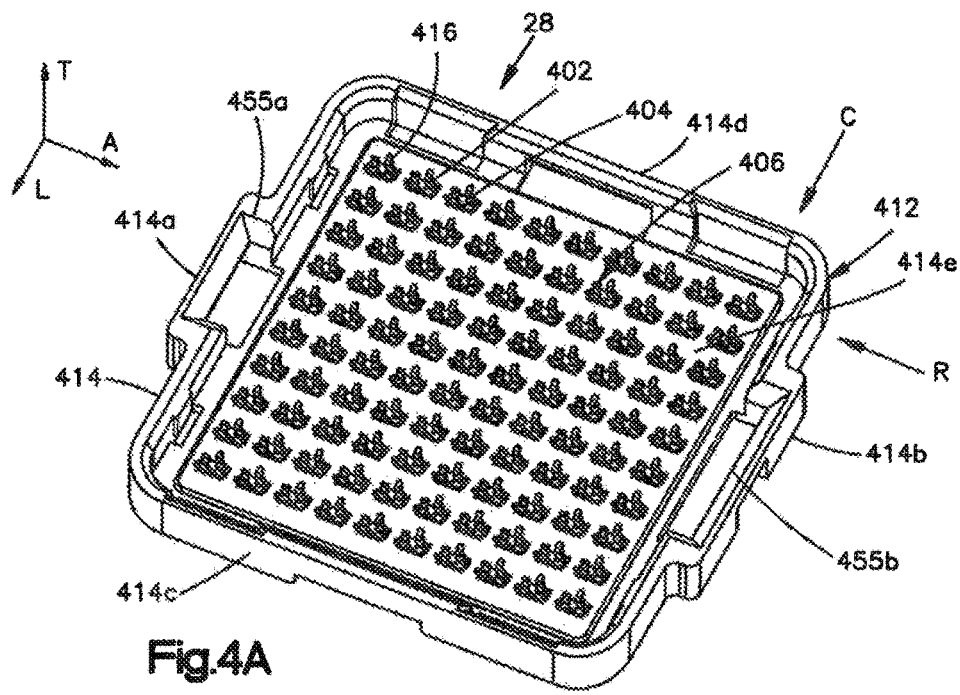
FIG. 4A is a perspective view of the first electrical connector illustrated in FIG. 3A, showing the mating interface.
Figure 4B:
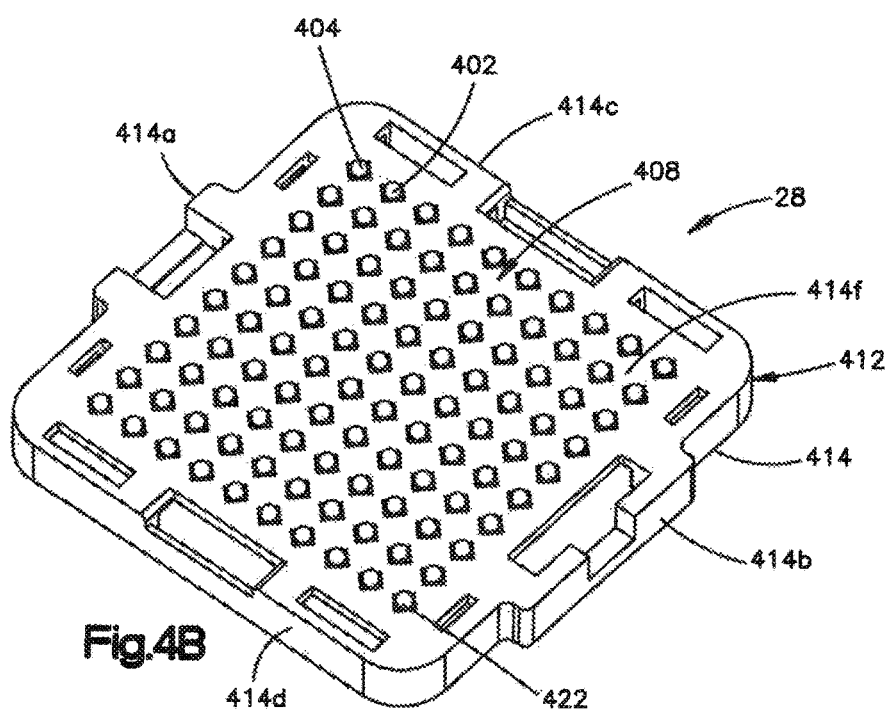
FIG. 4B is a perspective view of the first electrical connector illustrated in FIG. 3A, showing the mounting interface.
Figure 4C:
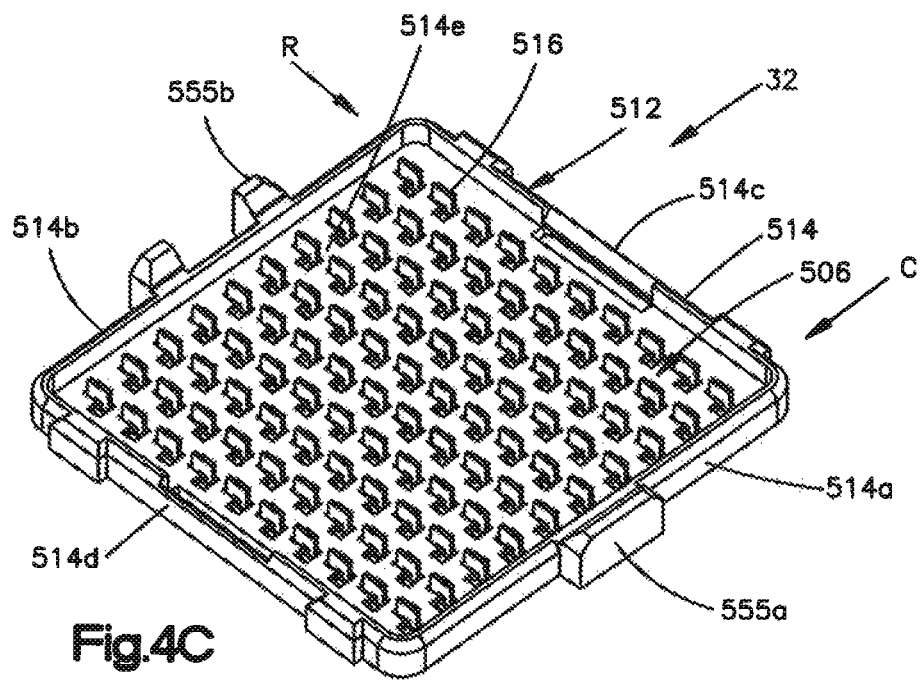
FIG. 4C is a perspective view of the second electrical connector illustrated in FIG. 3A, showing the mating interface.
Figure 4D:
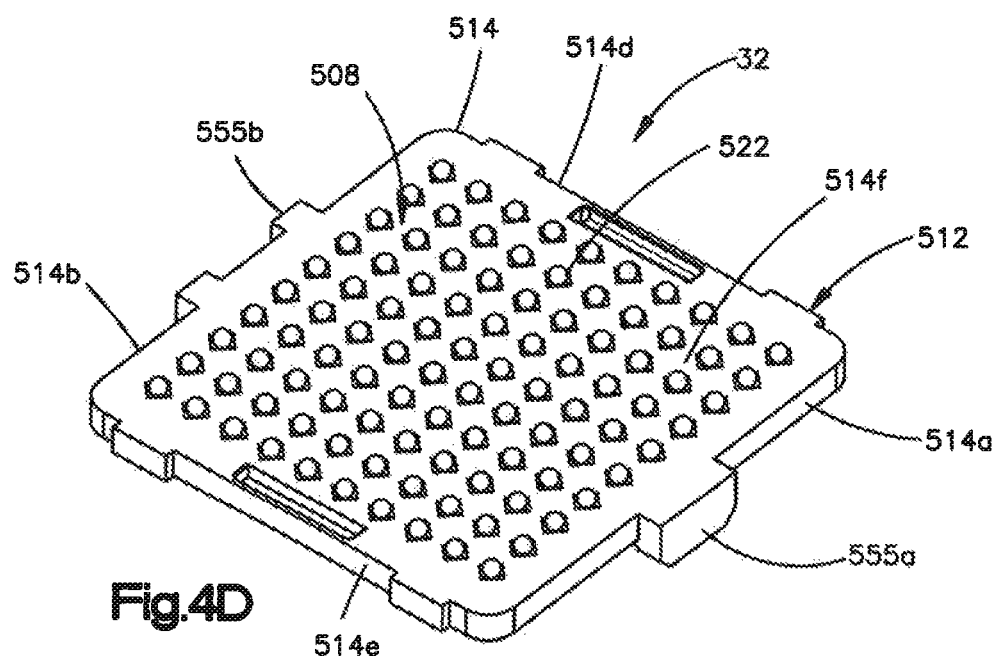
FIG. 4D is a perspective view of the second electrical connector illustrated in FIG. 3A, showing the mounting interface.
Figure 5B:
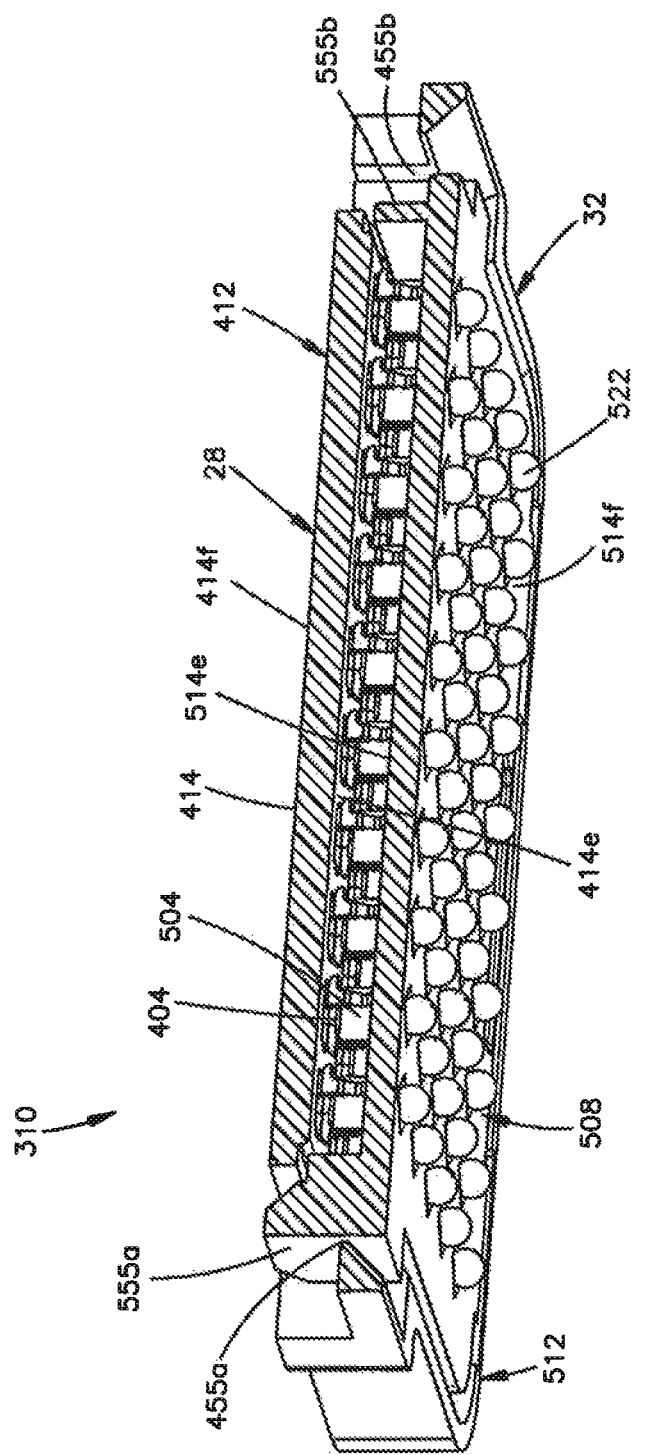
FIG. 5B is a sectional side elevation view of the first and second electrical connectors illustrated in FIG. 5A, taken along line 5B-5B.
Figure 11A:
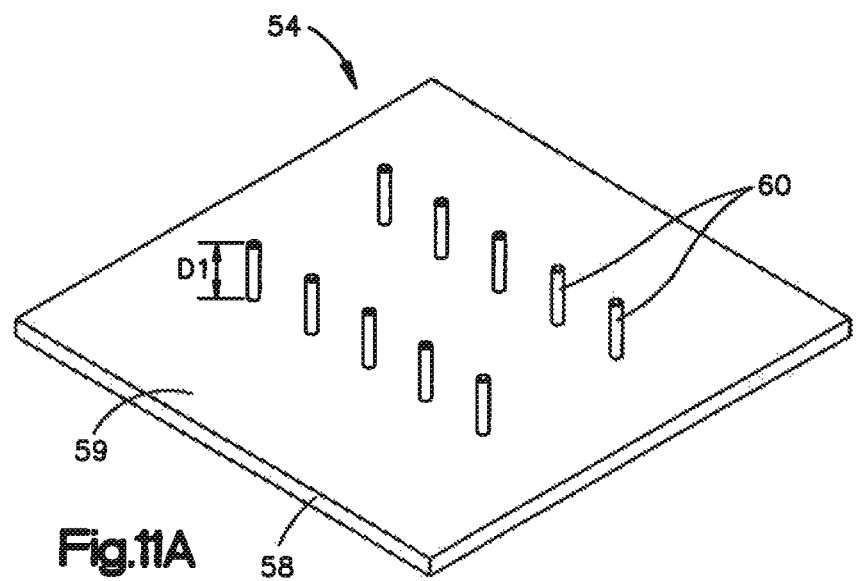
FIG. 11A is a schematic perspective view of a first separation member of the separator illustrated in FIG. 10.
Figure 11B:
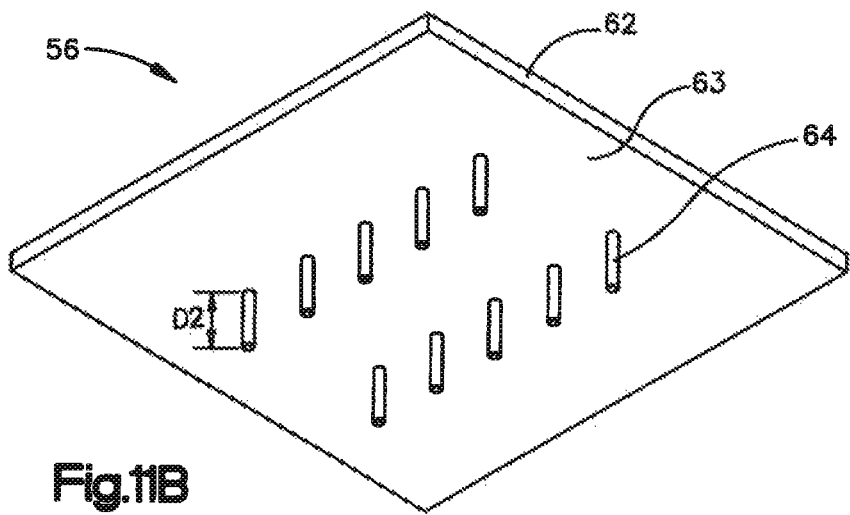
FIG. 11B is a schematic perspective view of a second separation member of the separator illustrated in FIG. 10.

Referring to FIG. 1, an electrical assembly 20 includes a first electrical sub-assembly 22 and a second electrical sub-assembly 24 that is configured to mate with the first electrical sub-assembly 22. In particular, the first electrical sub-assembly 22 includes a first substrate 26, which can be configured as a printed circuit board. The first substrate 26 defines a first surface 26a and a second surface 26b opposite the first surface 26a. The first electrical sub-assembly 22 further includes at least one first electrical connector 28 such as a plurality of first electrical connectors 28. The at least one first electrical connector 28 is configured to be mounted to the first substrate 26 so as to place the first substrate 26 in electrical communication with each of the at least one first electrical connector 28. Similarly, the second electrical sub-assembly 24 includes a second substrate 30, which can be configured as a printed circuit board. The second substrate 30 defines a first surface 30a and a second surface 30b opposite the first surface 30a. The second electrical sub-assembly 24 further includes at least one second electrical connector 32 such as a plurality of second electrical connectors 32. The at least one second electrical connector 32 is configured to be mounted to the second substrate 30 so as to place the second substrate 30 in electrical communication with each of the at least one second electrical connector 32. The first electrical connectors 28 are mounted to the first substrate 26 such that they extend out from the first surface 26a of the first substrate 26. Similarly, the second electrical connectors 32 are mounted to the second substrate 30 such that they extend out from the first surface 30a of the second substrate 30.

The at least one first electrical connector 28 and the at least one second electrical connector 32 are configured to mate with each other so as to mate the first electrical sub-assembly 22 with the second electrical sub-assembly 24. For instance, the first electrical connectors 28 are configured to mate with respective ones of the second electrical connectors 32. Thus, when the first and second electrical connectors 28 and 32 are mated with each other and mounted to the first and second substrates 26 and 30, respectively, it can be said that the first and second electrical sub-assemblies 22 and 24 are mated with each other. Similarly, when the first and second electrical sub-assemblies 22 and 24 are mated with each other, it can be said that the first and second electrical connectors 28 and 32 are mated with each other and mounted to the first and second substrates 26 and 30, respectively. When the at least one first electrical connector 28 and the at least one second electrical 32 are mated with each other, the first and second substrates 26 and 30 are placed in electrical communication with each other.

In particular, as described below with respect to FIGS. 3A-8B, each of the plurality of first electrical connectors 28 includes a dielectric or electrically insulative connector housing 412 and a plurality of electrical contacts 404 that are supported by the connector housing 412. The electrical contacts 404 of each of the plurality of first electrical connectors 28 are configured to be mounted onto the first substrate 26 at respective ones of a plurality of mounting locations that define a footprint on the first substrate 26. For instance, the plurality of first electrical connectors 28 can be mounted to the first surface 26a of the first substrate 26. Thus, the substrate 26 can define a first plurality of footprints each made up of a plurality of mounting locations. The plurality of first electrical connectors 28 are configured to mount to the first substrate 26 inside respective ones of the first plurality of footprints. The mounting locations can be configured as electrical contact pads, plated through holes, or the like to which the electrical contacts 404 are mounted. Thus, the electrical contacts 404 can be surface mounted to the first substrate 26 or inserted into through holes of the first substrate 26 so as to place the first electrical connectors in electrical communication with the first substrate 26.

Similarly, each of the plurality of second electrical connectors 32 includes a dielectric or electrically insulative connector housing 512 and a plurality of electrical contacts 504 that are supported by the connector housing 512. The electrical contacts 504 of each of the plurality of second electrical connectors 32 are configured to be mounted onto the second substrate 30 at respective ones of a plurality of mounting locations of the second substrate 30. The mounting locations of the second substrate 30 combine to define a footprint on the first substrate 26. For instance, the plurality of first electrical connectors 32 can be mounted to the first surface 30a of the first substrate 30. Thus, the second substrate 30 can define a second plurality of footprints each made up of a plurality of mounting locations. The plurality of second electrical connectors 32 are configured to mount to the second substrate 32 inside respective ones of the second plurality of footprints. The mounting locations can be configured as electrical contact pads, plated through holes, or the like to which the electrical contacts 504 are mounted. Thus, the electrical contacts 504 can be surface mounted to the second substrate 30 or inserted into through holes of the second substrate 30 so as to place the second electrical connectors 32 in electrical communication with the second substrate 30.

The first electrical connectors 28 are configured to mate with respective ones of the plurality of second electrical connectors 32 so as to place the first and second substrates 26 and 30 in electrical communication with each other. Thus, first electrical connectors 28 are configured to mate with respective ones of the plurality of second electrical connectors 32 so as to place the first and second electrical sub-assemblies 22 and 24 in electrical communication with each other. For instance, referring to FIGS. 9A-9B, the first substrate 26, which can also be referred to as a lower substrate, can be positioned on a support surface 34. In particular, the second surface 26b of the first substrate 26 can be positioned on the support surface 34, such that the second surface 26b is in surface contact with the support surface 34.

The second substrate 32, which can also be referred to as an upper substrate, can be positioned above the first substrate 28 such that the first and second substrates 28 and 32 are spaced from each other along a transverse direction T. Further, more the plurality of first electrical connectors 28 can be spaced from the plurality of second electrical connectors 32 along the transverse direction T. Further still, at least a portion of the plurality of first electrical connectors 28 can be aligned to be mated with respective ones of the plurality of second electrical connectors 32 along the transverse direction T. In one example, each of the plurality of first electrical connectors 28 can be aligned to be mated with respective ones of the plurality of second electrical connectors 32 along the transverse direction. Either or both of the first and second substrates 26 and 30 can be moved toward the other of the first and second substrates 26 and 30 along the transverse direction T such that first electrical connectors 28 mate with the respective aligned ones of the second electrical connectors 32. When the first and second electrical connectors 28 and 32 are mated to each other, such that the first and second electrical sub-assemblies 22 and 24 are mated to each other, the first and second substrates 26 and 30 can be oriented substantially parallel to each other. In particular, the first and second substrates 26 and 30 can be oriented along respective planes defined by first and second directions that are perpendicular to each other and perpendicular to the transverse direction T.

Further, the outer perimeter 26c of the first substrate 26 can be aligned with the outer perimeter 30c of the second substrate 30 along the transverse direction T when the first and second electrical sub-assemblies 22 and 24 are mated to each other. Alternatively, the outer perimeter 26c of the first substrate can be offset from the outer perimeter 30c of the second substrate with respect to a direction perpendicular to the transverse direction 'T'. Typically, a mating force is applied to the second surface 26b of the first substrate 26 along a direction toward the first substrate 26 in sufficient amount to cause the first electrical connectors 28 to mate with respective ones of the second electrical connectors 32. It should be appreciated that the electrical assembly 20 can include any number of first and second electrical connectors 28 and 32, from a few up to hundreds. Thus, the forces sufficient to mate the first and second electrical sub-assemblies can be up to 1500 pounds or more. The mating force can be distributed along the second surface 26b of the first substrate, and can cover any area as desired.

Referring now to FIGS. 9A-13B, it is envisioned that, from time to time, a reworking or reconfiguration of the electrical assembly 20 may be desired. However, it is appreciated that the normal forces of the mated electrical contacts of the mated first and second electrical connectors 28 and 32 against each other create a retention force that resists unmating of the first and second electrical connectors 28 and 32. Accordingly, a separation force applied to the substrates 26 and 30 that is sufficient to overcome the retention force will cause the first and second electrical connectors 28 and 32 to unmate, thereby allowing the first and second substrates 26 and 30 to separate from each other. Depending on the number of mated first and second electrical connectors 28 and 32, the cumulative retention force can be in the hundreds of pounds or more.

Accordingly, an electrical system 50 can include the electrical assembly 20 and a separator 52 that is configured to separate the first and second electrical sub-assemblies 22 and 24 after the first and second electrical sub-assemblies 22 and 24 have been mated with each other. The separator 52 can include a first separation member 54 and a second separation member 56 that, in combination, are configured to apply a separation force that overcomes the retention force and unmates all of the mated first and second electrical connectors 28 and 32. The first and second separation members 54 and 56 can be separate from each other, or can be attached to each other as desired.

The first separation member 54 can include a first base 58 and at least one first separation post 60 such as a plurality of first separation posts 60 that project out from a first surface of the first base 58 to respective tips. For instance, the first separation posts 60 can extend out from the first base 58 along a direction perpendicular with respect to the first base 58. The tips are thus spaced from the first base 58 along the transverse direction T. In this regard, it should be appreciated that the first base 58 can be configured as a plate having a surface 59, such that the first separation posts 60 project out from the surface 59. The surface 59 can also be referred to as a first surface, such that the base 58 defines a second surface 63 opposite the first surface 59. In one example, the first surface 59 can be a planar surface. Further, the second surface 63 can be a planar surface. For instance, the first and second surfaces 59 and 63 can be oriented parallel to each other. In one example, the first surface 59 can be oriented along a plane defined by the first and second directions that are perpendicular to each other and perpendicular to the transverse direction T when the first separation member 54 is coupled to the electrical assembly 20. It should be appreciated, of course, that the first separation member 54 can be constructed such that the first surface 59 can be oriented along any suitable alternative direction when the first separation member is coupled to the electrical assembly 20. The first separation posts 60 can be round, such as circular, in cross section, or can define any shape as desired. In one example, the first separation posts 60 can be cylindrical. The first separation posts 60 can be monolithic with the first base 58, or attached to the first base 58 in any manner as desired. The first separation member 54 can be metallic, plastic, or any other suitable material. Further, the first separation posts 60 can be parallel to each other.

Similarly, the second separation member 56 can include a second base 62 and at least one second separation post 64 such as a plurality of second separation posts 64 that project out from a first surface of the second base 62 to respective tips. For instance, the second separation posts 64 can extend out from the second base 62 along a direction perpendicular with respect to the second base 62. The tips of the second separation posts 64 are thus spaced from the second base 62 along the transverse direction T. For instance, the second separation posts 64 can extend out from the second base 62 along a direction perpendicular with respect to the second base 62. In one example, the plurality of each of the first and second separation posts 60 and 64 can be rigid.

In this regard, it should be appreciated that the second base 62 can be configured as a plate having a surface 63, such that the second separation posts 64 project out from the surface 63. The surface 63 can also be referred to as a first surface, such that the second base 62 defines a second surface 63 opposite the first surface 59. In one example, the first surface 59 of the second separation member 56 can be a planar surface. Further, the second surface 63 of the second separation member 56 can be a planar surface. For instance, the first and second surfaces 59 and 63 of the second separation member 56 can be oriented parallel to each other. In one example, the first surface 59 of the second separation member 56 can be oriented along a plane defined by the first and second directions that are perpendicular to each other and perpendicular to the transverse direction T when the second separation member 56 is coupled to the electrical assembly 20. It should be appreciated, of course, that the second separation member 56 can be constructed such that the first surface 59 of the second separation member 56 can be oriented along any suitable alternative direction when the first separation member is coupled to the electrical assembly 20. The second separation posts 64 can be round, such as circular, in cross section, or can define any shape as desired. In one example, the second separation posts 64 can be cylindrical. The second separation posts 64 can be monolithic with the second base 62, or attached to the second base 62 in any manner as desired. The second separation member 56 can be metallic, plastic, or any other suitable material. Further, the second separation posts 64 can be parallel to each other. Additionally, the first and second separation posts 60 and 64 can be parallel to each other when the first and second separation members 54 and 56 are coupled to the first and second substrates 26 and 30, respectively.

At least some up to all of the first separation posts 60 can project out from the first base 58 a first distance D1, and at least some up to all of the second separation posts 64 can project out from the second base 62 a second distance D2. The second distance D2 can be substantially equal to the first distance D1. Alternatively, the second distance D2 can be greater than the first distance D1. Alternatively still, the second distance D2 can be less than the first distance D1. When the first electrical subassembly 22 is mated to the second electrical subassembly 24, the second surface 26b of the first substrate 26 is spaced from the first surface 30a of the second substrate 30 a distance along the transverse direction T that is less than the first distance D1 of the first separation posts 60. Similarly, when the first electrical subassembly 22 is mated to the second electrical subassembly 24, the second surface 30b of the second substrate 30 is spaced from the first surface 26a of the first substrate 26 a distance along the transverse direction T that is less than the second distance D2 of the second separation posts 64.

When the first and second electrical connectors 28 and 32, and thus the first and second sub-assemblies 22 and 24, are mated to each other, the second surface 26b and 30b of at least one or both of the first and second substrates 26 and 30 is spaced a mated separation distance D from the first surface 26a and 30a of the other one of the first and second substrates 26 and 30. The mated separation distance can be measured along the transverse direction T. That is, the second surface 30b of the second substrate 30 is spaced from the first surface 26a of the first substrate 26 by the mated separation distance D. Further, the second surface 26b of the first substrate 26 is spaced from the first surface 30a of the second substrate 30 by the mated separation distance D.

In one example, at least one or both of the first and second distances D1 and D2 is greater than the mated separation distance D. Further, in order to unmate the first and second electrical connectors 28 and 32 from each other, one or both of the first and second electrical connectors 28 and 32 are moved away from each other an unmating distance. At least one or both of the first and second distances D1 and D2 can be at least equal to the sum of the mated separation distance and the unmating distance. For instance, at least one or both of the first and second distances D1 and D2 can be greater than the sum of the mated separation distance and the unmating distance.

Otherwise stated, when the first and second electrical connectors 28 and 32, and thus the first and second sub-assemblies 22 and 24, are mated to each other, one or both of the first and second substrates 26 and 30 is moved away from the other of the first and second substrates 26 and 30 in order to unmate the first and second electrical connectors 28 and 32 from each other, whereby the first and second substrates 26 and 30 are separated from each other by an unmated separation distance D. In particular, the second surface 26b and 30b of at least one or both of the first and second substrates 26 and 30 is spaced from the first surface 26a and 30a of the other one of the first and second substrates 26 and 30 by the unmated separation distance D. That is, the second surface 30b of the second substrate 30 is spaced from the first surface 26a of the first substrate 26 by the unmated separation distance D. Further, the second surface 26b of the first substrate 26 is spaced from the first surface 30a of the second substrate 30 by the unmated separation distance D. The unmated separation distance D can be measured along the transverse direction T. At least one or both of the first and second distances D1 and D2 can be at least equal to the unmated distance D. For instance, at least one or both of the first and second distances D1 and D2 can be greater than the unmated distance D. Alternatively, the first and second distances D1 and D2 can be less than the unmated separation distance D, but sufficiently long to overcome the highest retention force experienced when unmating the first and second electrical sub-assemblies 22 and 24 from each other. It is appreciated that the retention force is a result of the sum of the normal forces of all of the mated electrical contacts of all of the first and second electrical connectors 28 and 32 that are mated to each other. When a separation force applied to the first and second electrical sub-assemblies 22 and 24 that urges the first and second subassemblies 22 and 24 away from each other, and the separation force is greater than the retention force, then the separation force is sufficient to cause the first and second electrical sub-assemblies 22 and 24 to unmate from each other. The first and second separation members 54 and 56 can be constructed identical to each other. Alternatively, the first separation posts 60 can be disposed at a first location with respect to the outer perimeter of the first base 58, and the second separation posts 64 can be disposed at a second location with respect to the outer perimeter of the second base 62 that is different than the first location.

Referring again to FIGS. 1-2B, the first substrate 26 can define a plurality of first apertures 66 that extend therethrough from the first surface 26a to the second surface 26b. In one example, the first apertures 66 can extend through the first substrate along the transverse direction T. The first apertures 66 can be sized in cross-section substantially equal to or slightly greater than the size of the first separation posts 60 in cross-section such that the first separation posts 60 are sized and configured for insertion through respective ones of the first apertures 66. In this regard, it should be appreciated that the first apertures 66 can define a first spatial relationship with respect to each other, and the first separation posts 60 can define the same first spatial relationship with respect to each other, such that all of the first separation posts 60 can be configured to be received by respective ones of the first apertures 66.

Similarly, the second substrate 30 can define a second plurality of apertures 68 that extend therethrough from the first surface 30a to the second surface 30b. In one example, the second plurality of apertures 68 can extend through the second substrate 30 along the transverse direction T. The second apertures 68 can be sized in cross-section substantially equal to or slightly greater than the size of the second separation posts 64 in cross-section such that the second separation posts 64 are sized and configured for insertion through respective ones of the second apertures 68. In this regard, it should be appreciated that the second apertures 68 can define a second spatial relationship with respect to each other, and the second separation posts 64 can define the same second spatial relationship with respect to each other, such that all of the second separation posts 64 can be configured to be received by respective ones of the second apertures 68. The first spatial relationship can be the same as or different than the second spatial relationship.

When the first and second electrical connectors 28 and 32 are aligned along the transverse direction T, for instance when they are aligned to be mated with each other or when they are mated with each other, the first plurality of apertures 66 are offset with respect to the second plurality of apertures 68 along a direction that is perpendicular to the transverse direction T. Further, the first separation posts 60 can be offset with respect to all of the second separation posts 64 along a plane that is perpendicular to the transverse direction T. Accordingly, the second separation posts 64 do not interfere with the first separation posts 60 as they extend through the first plurality of apertures 66 to the second substrate 30. Similarly, the first separation posts 60 do not interfere with the second separation posts 64 as they extend through the second plurality of apertures 68 to the first substrate 26. Otherwise stated, when the first and second pluralities of separation posts 60 and 64 are disposed such that a plane normal to the transverse direction T extends through each of the plurality of first and second separation posts 60 and 64 while the first and second separation members are coupled to the first and second substrates 26 and 30, respectively, each of the first separation posts 60 is spaced from each of the second separation posts along the plane.

Further, the first plurality of separation posts 60 can be equidistantly spaced along the plane, such that the separation posts 60 apply an evenly distributed separation force to the second substrate 30. Similarly, the second plurality of separation posts 60 can be equidistantly spaced along the plane, such that the separation posts 64 apply an evenly distributed separation force to the first substrate 26. Alternatively, the first separation posts 60 can be variably spaced along the plane, and the second separation posts 64 can be variably spaced along the plane.

Thus, it should be appreciated that the first and second separation members 54 and 56 can be configured such that the first and second bases 58 and 62 can face each other and can be aligned with each other while none of the first separation posts 60 are aligned with the second separation posts 64 along the transverse direction T when the first separation posts 60 extend toward the second base 62 and the second separation posts 64 extend toward the first base 58. In one example, the outer perimeter of the first base 58 can be aligned with the outer perimeter of the second base 62 along the transverse direction T while none of the first separation posts 60 are aligned with the second separation posts 64 along the transverse direction T when the first separation posts 60 extend toward the second base 62 and the second separation posts 64 extend toward the first base 58.

It is appreciated that the apertures 66 can be positioned so as to not interfere with signal routing through the first substrate 26. Similarly, the apertures 68 can be positioned so as to not interfere with signal routing through the second substrate 30. Otherwise said, the apertures 66 are spaced from all electrical routing traces that extend through the first substrate 26 and are in electrical communication with respective ones of the first electrical connectors 28. Similarly, the apertures 68 are spaced from all electrical routing traces that extend through the second substrate 30 and are in electrical communication with respective ones of the second electrical connectors 32.

Further, each of the first apertures 66 can be offset from the mounting footprints of the first substrate 26 in a direction perpendicular to the transverse direction T, such that the mounted first electrical connectors 28 do not interfere with the first separation posts 60 when the first separation member 54 is coupled to the electrical assembly 20. For instance, each of the first apertures 66 can be disposed outside each of the mounting footprints of the first substrate 26. Similarly, each of the second apertures 68 can be offset from the mounting footprints of the second substrate 30 in a direction perpendicular to the transverse direction T, such that the mounted second electrical connectors do not interfere with the second separation posts 64 when the second separation member 56 is coupled to the electrical assembly 20. For instance, each of the second apertures 68 can be disposed outside each of the mounting footprints of the second substrate 30.

Further, each of the first separation posts 60 can be out of alignment with the mounting footprints of the second substrate 30 when the first separation member 54 is coupled to the electrical assembly 20. Accordingly, the first separation posts 60 are not aligned with the second electrical connectors 32 that are mounted to the second substrate 30. For instance, each of the first separation posts 60 can be disposed outside the footprints of the second substrate 30 with respect to the direction perpendicular to the transverse direction T. Similarly, each of the second separation posts 64 can be out of alignment with the mounting footprints of the first substrate 26 when the second separation member 56 is coupled to the electrical assembly 20. Accordingly, the second separation posts 64 are not aligned with the first electrical connectors 28 that are mounted to the first substrate 26. For instance, each of the second separation posts 64 can be disposed outside the footprints of the first substrate 26 with respect to the direction perpendicular to the transverse direction T.

It is appreciated that the first and second apertures 66 and 68 can have the same size and shape as each other. Alternatively, one or both of the first and second apertures 66 and 68 can be keyed to only receive the first and second separation posts 60 and 64, respectively. For instance, in one example, the first apertures 66 can have the same cross-sectional shape as the first separation posts 60, and a different cross-sectional shape than the second apertures 68 and thus the second separation posts 64. Similarly, the second apertures 68 can have the same cross-sectional shape as the second separation posts 64, and a different cross-sectional shape than the first apertures 66 and thus the first separation posts 60. The first separation posts 60 can have a different cross-sectional shape with respect to the second separation posts 64, such that the first separation posts 60 are sized and configured to be received by respective ones of the first apertures 66, but are not sized and configured to be received by respective ones of the second apertures 68. Alternatively or additionally, the second separation posts 64 can be sized and configured to be received by respective ones of the second apertures 68, but are not sized and configured to be received by respective ones of the first apertures 66.

During operation, when it is desired to separate the first and second electrical sub-assemblies 22 and 24 after the first and second electrical connectors 28 and 32 are mated to each other, the first separation posts 60 can be inserted through respective ones of the first apertures 66 in a first direction from the second surface 26*b* toward the first surface 26*a*. The first direction can be oriented along the transverse direction T. Alternatively, the first direction can be angularly offset with respect to the transverse direction T while intersecting a plane that is oriented normal to the transverse direction T. Thus, the first separation posts 60 are inserted through the apertures 66 in a direction from the first substrate 26 toward the second substrate 30. The first separation posts 60 can be inserted through the first apertures 66, respectively, until the first separation posts 60 are placed in mechanical communication with the second substrate 30. For instance, the first separation posts 60 can abut the second substrate 30, for instance at the first surface 30*a* of the second substrate 30. In particular, the tips of the first separation posts 60 can abut the second substrate 30, for instance at the first surface 30*a* of the second substrate 30. Thus, each of the first separation posts 60 can have the same height from the first base to the respective tips along the transverse direction. Alternatively, the first separation posts 60 can abut an intermediate structure that, in turn, abuts the second substrate 30, for instance at the first surface 30*a*. It is appreciated that when the first separation posts 60 are placed in mechanical communication with the second substrate 30, the first base 58 can be spaced from the first substrate 26 so as to define a first gap 70 that extends between the first substrate 26 and the first base 58. For instance, the first base 58 can be spaced from the first substrate 26, and in particular from the second surface 26*b* in the first direction from the first substrate 26 toward the second substrate 30. Thus, the first gap 70 can extend in the first direction. As described above, the first direction can be oriented along the transverse direction T. The first base 58, and in particular the first surface 59, can be oriented substantially parallel to the first substrate 26.

Further, the second separation posts 64 can be inserted through respective ones of the second apertures 68 in a second direction from the second surface 30*b* toward the first surface 30*a*. The second direction can be opposite the first direction. Accordingly, the second direction can be oriented along the transverse direction T. Alternatively, the second direction can be angularly offset with respect to the transverse direction while intersecting a plane that is oriented normal to the transverse direction T. Thus, the second separation posts 64 are inserted through the second apertures 68 in a direction from the second substrate 30 toward the first substrate 26. The second separation posts 64 can be inserted through the second apertures 68, respectively, until the second separation posts 64 are placed in mechanical communication with the first substrate 26. For instance, the second separation posts 64 can abut the first substrate 26, for instance at the first surface 26*a* of the first substrate 26. In particular, the tips of the second separation posts 64 can abut the second substrate 30, for instance at the first surface 30*a* of the second substrate 30. Thus, each of the second separation posts 64 can have the same height from the second base to the respective tips along the transverse direction. Further, the height of the second separation posts 64 can be the same as the height of the first separation posts 60.

It should also be appreciated that the second separation posts 64 can abut an intermediate structure that, in turn, abuts the first substrate 26, for instance at the first surface 26*a*. It is appreciated that when the second separation posts 64 are placed in mechanical communication with the first substrate 26, the second base 62 can be spaced from the second substrate 30 so as to define a second gap 72 that extends between the second substrate 30 and the second base 62. For instance, the second base 62 can be spaced from the second substrate 30, and in particular from the second surface 30*b* in the second direction from the second substrate 30 toward the first substrate 26. Thus, the second gap 72 can extend in the second direction. As described above, the second direction can be oriented along the transverse direction T. The second base 62, and in particular the second surface 63, can be oriented substantially parallel to the second substrate 30. Thus, the second bass 62, and in particular the second surface 63, can also be oriented substantially parallel to the first base 58 and in particular to the first surface 59. It should be appreciated that the term "substantially" as used herein with respect to directions and dimensions is intended to include manufacturing tolerances. The second gap 72 can be sized equal to the first gap 70. Alternatively, the second gap 72 can be sized different than the first gap 70. For instance, the second gap 72 can be sized greater than the first gap 70. Alternatively, the second gap 72 can be sized less than the first gap 70.

Once the first separation posts 60 extend through the first apertures 66, the first separation member 54 can be referred to as coupled to the first electrical sub-assembly 22, and thus coupled to the electrical assembly 20 when the first electrical sub-assembly 22 is mated to the second electrical sub-assembly 24. When the first separation posts 60 extend through the first apertures 66 and are in mechanical communication with the opposed second substrate 30 in the manner described above, the first separation member 54 can be referred to as being in an armed position. Similarly, once the second separation posts 64 extend through the second apertures 68, the second separation member 56 can be referred to as coupled to the second electrical sub-assembly 24, and thus coupled to the electrical assembly 20 when the second electrical sub-assembly 24 is mated to the first electrical sub-assembly 22. When the second separation posts 64 extend through the second apertures 68 and are in mechanical communication with the opposed first substrate 26, the second separation member 56 can be referred to as being in an armed position.

When the first and second separation members 54 and 56 are both coupled to the first and second electrical sub-assemblies 22 and 24, respectively, the separator 52 can then be referred to as coupled to the electrical assembly 20. When the first and second separation members 54 and 56 are both in the armed position, the separator 52 can then be said to be in the armed position. When the separator 52 is in the armed position, one of the first and second separation members 54 and 56 can be placed against a support member. In one example, the support member can define a support surface that is in surface contact with the base of the one of the first and second separation members 54 and 56. Thus, the base of the one of the first and second separation members 54 and 56 is disposed between the support surface and the base of the other of the first and second separation members 54 and 56. In one example, the support surface can be a planar surface.

A separation force can then be applied to the other one of the first and second separation members 54 and 56. The separation force can be a compression force that is directed toward the one of the first and second separation members 54 and 56, and thus toward the one of the first and second substrates 26 and 30 through which the separation posts of the one of the first and separation members 54 and 56 extend. The separation force can be oriented in the transverse direction T. The compressive force can be applied to a surface of the base that is opposite the surface from which the separation posts extend. Because the one of the first and second separation members 54 and 56 is supported by the support member, when the compressive force is applied to the other of the first and second separation members 54 and 56, the support member can apply an equal and opposite force against the one of the first and second separation members 54 and 56. Alternatively, a compressive force can be directly applied to each of the first and second separation members 54 and 56 without first supporting one of the first and second separation members 54 and 56 by a support member.

When the separation force reaches a threshold, for instance greater than the retention force of the first and second electrical connectors 28 and 32, the base of at least one or both of the first and second separation members 54 and 56 translates toward the respective first and second substrate 26 and 30, respectively, thereby closing the respective gaps. For instance, it is envisioned that one of the first and second bases 58 and 62 can abut the respective one of the first and second substrates 26 and 30, and the other of the first and second bases 58 and 62 can be spaced from the respective other of the first and second substrates 26 and 30 when the separator is in the armed position. In this instance, only the other of the first and second bases 58 and 62 would translate toward the respective other of the first and second substrates 26 and 30 when the compressive force is applied to the other of the first and second separation members 54 and 56.

In another embodiment, both bases 58 and 62 are spaced from the respective first and second substrate 26 and 30, such that both bases 58 and 62 move toward the respective substrate 26 and 30, respectively. It is appreciated that as the bases 58 and 62 move toward the respective substrates 26 and 30, the separation posts 60 and 64 bias the opposite one of the first and second substrate 26 and 30 away from the respective substrate. Thus, the first separation posts 60 bias the second substrate 30 away from the first substrate 26. Similarly, the second separation posts 64 bias the first substrate 26 away from the second substrate 30. Accordingly, at least one or both of the first and second substrates 26 and 30 is biased away from the other of the first and second substrates 26 and 30, thereby causing the electrical connectors 28 and 32 to unmate from each other. The at least one of the first and second bases 58 and 62 that defines the respective one of the first and second gaps 70 or 72 when the first and second electrical connectors 28 and 32 are mated can abut the respective one of the first and second substrates 26 and 30 when the first and second electrical connectors 28 and 32 have been unmated from each other. The first separation member 54 can then be removed from the first substrate 26 by removing the first separation posts 60 from the first apertures 66 along the second direction. Similarly, the second separation member 56 can then be removed from the second substrate 30 by removing the second separation posts 64 from the second apertures 68 along the first direction.

In accordance with one embodiment, when the separator 52 is in the armed position, the first separation member 54 can be placed against the support member. In particular, the first base 58 can be in contact with the support surface of the first support member 54. Thus, the first base 58 is disposed between the support surface and the second base 62

A separation force can then be applied to the second separation member 56. The separation force can be a compression force that is directed toward the first separation member 54, and thus toward the first substrate 26. The separation force can be oriented in the transverse direction T. The compressive force can be applied to a surface of the second base 62. Because the first separation member 54 is supported by the support member, when the compressive force is applied to the second separation member 56, the support member can apply an equal and opposite force against the first separation member 54. Alternatively, a compressive force can be directly applied to each of the first and second separation members 54 and 56 without first supporting the first separation member 54 by the support member.

Methods can be provided for unmating the plurality of first electrical connectors 28 that are mounted onto the first substrate 26 from the second plurality of electrical connectors 32 that are mounted onto the second substrate 30. The method can include the step of inserting the plurality of first separation posts 60 through the respective first apertures 66 in a direction toward the second substrate 30. The method can further include the steps of placing the first separation posts 60 in mechanical communication with the second substrate 30, and applying a separation force to the first base 58 in a direction toward the first substrate 26, thereby causing the first separation posts 60 to urge the second substrate 30 away from the first substrate 26 so as to unmate the first electrical connectors 28 from the second electrical connectors 32. The placing step create a first gap between the first base 58 and the first substrate 26, and the applying step closes the gap. For instance, the applying step can cause the first base 58 to abut the first substrate 26. The placing step can place the respective tips of the first separation posts 60 in contact with the second substrate 30.

The method can further include the step of inserting the plurality of second separation posts 64 through the second apertures 68 in a direction toward the first substrate 26. The method can further include the steps of placing the second separation posts 64 in mechanical communication with the first substrate 26, and bracing the second base 62 against the separation force during the applying step. The step of placing the second separation posts 64 creates a second gap between the second base 62 and the first substrate 26, and the bracing step closes the second gap. The bracing step can cause the second base 62 to abut the second substrate 30. The step of placing the second separation posts 64 can place respective tips of the second separation posts 64 in contact with the first substrate 26.

The first and second electrical connectors 28 and 32 can be configured in accordance with any suitable embodiment as desired, sufficient to place the first and second substrates 26 and 30 in electrical communication with each other. In one example, referring to FIGS. 3A-4D, the first electrical connectors 28 are configured to mate with the second electrical connector 32 so as to place the electrical cables 300 in electrical communication with the electrical component 600. Thus, though the electrical connector 28 is configured to be mounted onto the first substrate 26, the first substrate 26 places the mounted electrical connector 28 in electrical communication with the electrical cables 300 before the electrical connector 28 is mated with the second electrical connector 32. For instance, the electrical connector 28 includes a connector housing 412 and an array of electrical contacts 404 that are supported by the connector housing 412. The electrical connector 28 can be referred to as a first electrical connector, the connector housing 412 can be referred to as a first connector housing, and the array of electrical contacts 404 can be referred to as a first array of electrical contacts. The connector housing 412 can be made of any suitable dielectric material, such as plastic and the electrical contacts 404 can be made of any suitable electrically conductive material, such as metal. In accordance with the illustrated embodiment, the connector housing 412 can be overmolded onto the electrical contacts 404. Alternatively, the electrical contacts 404 can be stitched into the connector housing 412 or otherwise supported by the connector housing 412 as desired. The first electrical connector 28 is configured to be mounted to the first substrate 26 at the mounting interface 408 such that the first electrical connector 28 is placed in electrical communication with the first substrate 26.

The connector housing 412 can include a housing body 414 that defines opposed first and second sides 414a and 414b that are spaced from each other along a first or longitudinal direction L, opposed third and fourth sides 414c and 414d that are spaced from each other along a second or lateral direction A that extends substantially perpendicular to the longitudinal direction L, an inner end 414e that defines a mating interface 406, and an outer end 414f that is spaced from the inner end 414e along a third or transverse direction T and defines an opposed mounting interface 408. The transverse direction T extends substantially perpendicular to both the longitudinal direction L and the lateral direction A. It should be appreciated that in accordance with the illustrated embodiment, the longitudinal direction L and the lateral direction A are oriented horizontally, and the transverse direction T is oriented vertically, though it should be appreciated that the orientation of the first electrical connector 28, and thus the electrical assembly 20, can vary during use. Unless otherwise specified herein, the terms "lateral," "laterally," "longitudinal," "longitudinally," "transverse," and "transversely" are used to designate perpendicular directional components in the drawings to which reference is made.

Similarly, the second electrical connector 32 can include a connector housing 512, which can be referred to as a second connector housing, that is configured to support the second array 502 of electrical contacts 504, which can be referred to as a second array of electrical contacts. The connector housing 512 can be made of any suitable dielectric material, such as plastic and the electrical contacts 504 can be made of any suitable electrically conductive material, such as metal. In accordance with the illustrated embodiment the connector housing 512 can be overmolded onto the electrical contacts 504. Alternatively, the electrical contacts 504 can be stitched into the connector housing 512 or otherwise supported by the connector housing 512 as desired. The connector housing 512 can include a housing body 514 that defines opposed first and second sides 514a and 514b that are spaced from each other along a first or longitudinal direction L, opposed third and fourth sides 514c and 514d that are spaced from each other along a second or lateral direction A that extends substantially perpendicular to the longitudinal direction L, an inner end 514e, and an outer end 514f that is spaced from the inner end 514e along a third or transverse direction T that extends substantially perpendicular to both the longitudinal direction L and the lateral direction A. The inner end 514e can define the mating interface 506, and the outer end 514f can define a mounting interface 508 of the second electrical connector 32. The second electrical connector 32 is configured to be mounted to the electrical component 600 at the mounting interface 508.

Accordingly, when the first and second electrical connectors 28 and 32 are mated to each other, such that the mating interface 406 of the first electrical connector 28 engages with the mating interface 506 of the second electrical connector 32 to place the respective arrays of electrical contacts 404 and 504 in electrical communication with each other, the first and second electrical connectors 28 and 32 can operate to place the first substrate 26 in electrical communication with the second substrate 30.

Because the mating interface 406 of the first electrical connector 28 and the mating interface 506 of the second electrical connector 32, respectively, are oriented substantially parallel to the respective mounting interfaces 408 and 508, the first and second electrical connectors 28 and 32 can be referred to as vertical or mezzanine electrical connectors. However it should be appreciated that one or both of the first and second electrical connectors 28 and 32 can be otherwise constructed as desired, for instance as right-angle electrical connectors such that the respective mating interfaces are oriented substantially perpendicular to the respective mounting interfaces.

Further in accordance with the illustrated embodiment, the electrical contacts 404 of the first array 402 of electrical contacts 404 are arranged into at least two such as a plurality of rows that extend along a row direction R that can be defined by the longitudinal direction L and into at least two such as a plurality of columns that extend substantially perpendicular to the rows along a column direction C that can be defined by the lateral direction A. As illustrated, each row or electrical contacts 404 can intersect with every column of electrical contacts 404, and each column of electrical contacts can intersect with every row of electrical contacts 404. In this regard, it can be said that each of the at least two rows of electrical contacts 404 intersects each of the at least two columns of electrical contacts 404. Similarly, in accordance with the illustrated embodiment, the electrical contacts 504 of the second array 502 of electrical contacts 504 are arranged into at least two such as a plurality of rows that extend along a row direction R that can be defined by the longitudinal direction L and into at least two such as a plurality of columns that extend substantially perpendicular to the rows along a column direction C that can be defined by the lateral direction A. As illustrated, each row or electrical contacts 504 can intersect with every column of electrical contacts 504, and each column of electrical contacts can intersect with every row of electrical contacts 504. In this regard, it can be said that each of the at least two rows of electrical contacts 504 intersects each of the at least two columns of electrical contacts 504. The arrays 402 and 502, respectively, can define any number of columns and rows of electrical contacts 404 and 504, respectively, as desired as described herein. The rows and columns of the first and second electrical connectors 28 and 32 can be numerically and spatially identical to each other.

Referring also to FIGS. 6A-6B, each electrical contact 404 can have a contact body 405 that defines a mating end 416 that extends out from that mating interface 406, an opposed mounting end 418 that extends out from the mounting interface 408, and a lead portion 419 that extends between the mating end 416 and the mounting end 418. At least a portion of the contact body 405 of each electrical contact 404 can be curved between the mating and mounting ends 416 and 418, respectively, as it extends between the mating end 416 and the mounting end 418 along the transverse direction T. As described in U.S. Pat. No. 6,042,389, which is incorporated by reference as if set forth in its entirety herein, each of the electrical contacts 404 can be a receptacle contact that include a base 404a, and a pair of cantilevered spring arms, including a first spring arm 404b and a second spring arm 404c that each extends from the base 404a along the transverse direction T toward the inner end 414e, such that the mounting end 418 extend from the base 404a toward the outer end 414f. Each spring arm 404b and 404c can be resiliently supported by the base 404a, and can extend from the base 404a to a respective free distal tip 420. The base 404a can be defined by the lead portion 419.

Each of the first cantilevered spring arm 404b and the second cantilevered spring arm 404c of each electrical contact 404 can be offset from each other both along the row direction R such that each electrical contact defines a gap between the spring arms 404b and 404c along the row direction R. The spring arms 404b and 404c can further be spaced from each other along the column direction C. For instance, each spring arm 404b and 404c can further define a curved region between the base 404a and the respective distal tip 420, for instance a region of generally "S" shaped curvature. Thus, the tip 420 of each spring arm 404b and 404c is offset along the longitudinal direction L with respect to the mounting end 418. One of the spring arms 404b and 404c can be curved such that the distal tip 420 is offset toward one of the first side 414a or the second side 414b with respect to the mounting end 418, and the other of the spring arms 404b and 404c can be curved such that the distal tip 420 is offset toward the other of the first side 414a or the second side 414b with respect to the mounting end 418. The first and second spring arms 404b and 404c are configured to flex with respect to the base 404a away from each other when a plug mating end, for instance of the second electrical connector 32 is inserted between the spring arms 404b and 404c along the column direction C.

The electrical contacts 404 can further include respective solder balls 422 that project out from the mounting end 418 proximate to the mounting interface 408. The solder balls 422 can be attached or otherwise supported by the mounting ends 418, for instance fused to the mounting end 418, and are configured to be mounted to the electrically conductive contact pads 108 of the first substrate 26, for instance by positioning the first electrical connector 28 on the first substrate 26 and subjecting the first electrical connector 28 and the first substrate 26 to a solder reflow process whereby the solder balls 422 fuse to the respective ones of the contact pads of the first substrate 26. The solder balls 422 can all be co-planar with each other along the mounting interface 408, both before and after the solder reflow process is completed. It should further be appreciated that the electrical contacts 404 are not limited to the illustrated mounting ends 418, and that the mounting ends 418 can be alternatively configured with any other suitable fusible or non-fusible element as desired, such as press-fit mounting tails configured to be inserted into complementary vias of the first substrate 26.

The first electrical connector 28 can define a plurality of pockets 424 that extend into the housing body 414 along the transverse direction T. For instance, the pockets 424 can extend into the outer end 414f of the housing body 414 of the connector housing 412 along the transverse direction T toward the inner end 414e. The mounting ends 418 of the contact body 405 can extend into the pockets 424, such that the solder balls 422 are disposed in respective ones of the pockets 424. Accordingly, the mounting ends of each of the electrical contacts 404, which can include the mounting ends 418 of the contact body 405 and the respective solder ball 422 can be at least partially disposed in the pockets 424. Thus, when the first array 402 of electrical contacts 404 is supported by the connector housing 412, each solder ball 422 is at least partially recessed with respect to the outer end 414f of the housing body 414, in a respective one of the plurality of pockets 424. In this regard, it can be said that the solder balls 422 of the first array 402 of electrical contacts 404 protrude out with respect to the outer end 414f of the housing body 414.

With continuing reference to FIGS. 6A-6B, the connector housing 412 can further define a plurality of retention apertures that extend through the housing body 414 along the transverse direction T from the inner end 414e of the housing body 414 of the connector housing 412 to the outer end 414f of the housing body 414. The retention apertures can include retention cavities 426 that extend into the inner end 414e of the housing body 414 of the connector housing 412 along the transverse direction T, and the plurality of pockets 424 that are substantially aligned with the retention cavities 426 along the transverse direction T. The retention cavities 426 can be configured to at least partially receive a respective retention portion of the electrical contacts 404, such that when the first array 402 of electrical contacts 404 is supported by the connector housing 412, the mating end 416 of each electrical contact 404 protrudes out with respect to the inner end 414e of the housing body 414. Each retention cavity 426 can be at least partially defined by at least one inner wall 427. Further, each retention cavity 426 can be at least partially defined by a shelf 427a that extends in from the inner walls 427 at a location between the inner end 414e and the outer end 414E Each shelf 427a can be substantially parallel to the inner end 414e and the outer end 414f. The pockets 424 can be disposed between the shelf 427a and the outer end 414f. The connector housing 412 can define a height H3 along the transverse direction T from the inner end 414e to the outer end 414f from 0.3 mm to 0.7 mm, for instance 0.5 mm. The connector housing 412 can define a height H4 along the transverse direction T from the inner end 414e to the shelf 427a from 0.2 mm to 0.4 mm, for instance 0.3 mm.

The electrical contacts 404 can include broadsides 475a and edges 475b as defined above with respect to the electrical contacts 104. The electrical contacts 404 can further include a retention portion that includes at least one retention wing 415, for instance first and second opposed retention wings 415 that project out from opposed sides of the base 404a, for instance along the row direction R. Thus, the retention wings 415 that project out from opposed sides of the base 404a in opposite directions along a first direction that separates opposed edges of the electrical contacts 404. The retention wings 415 can extend to a location outboard of both the base 404a portion and the respective ones of the first and second spring arms 404b and 404c. The retention wings 415 can project out to respective free distal tips 415a that are spaced from each other connector a distance along a select direction that is slightly greater than the cross-sectional dimension of the retention cavity 426 along the select direction. Accordingly, the retention wings 415 can be press-fit against the at least one inner wall 427 so as to retain the electrical contact 404 in the connector housing 412.

Thus, in accordance with one embodiment, the electrical contacts 404 touch the connector housing 412 at only two locations, defined by respective abutments between the retention wings 415 and the at least one inner wall 427. Further, as illustrated in FIG. 6B, the broadsides of the electrical contacts 404 are spaced from the at least one inner wall 427, along a second direction that separates the opposed broadsides, along an entirety of a length between the opposed retention wings 415 along the first direction that separates the opposed edges. Further, the broadsides can be continuous from one of the retention wings 415 to the other of the retention wings, and from each of the spring arms 404b and 404c to the mounting end 418. Moreover, the electrical contacts 404 can be devoid of enclosed apertures that extend through the contact body 405 from one broadside to the other broadside.

Because wicking of solder flux during the solder reflow operation is directed toward contact locations between the contact body 405 and the connector housing 412, the electrical contacts are configured such that any wicking will occur between the retention wings 415 and the connector housing 412, which is offset from a data flow path between the mounting end 418 and each of the spring arms 404b and 404c, Thus, the data flow path is substantially devoid of wicked solder flux. Furthermore, because the contact body is substantially planar in the pocket 424, the solder is able to substantially fill the pocket 424 during the solder reflow operation.

Each electrical contact 404 can define a thickness in the longitudinal direction L of approximately 0.1 mm. Thus, the opposed broadsides of each electrical contact 404 can be spaced from each other a distance of approximately 0.1 mm. The thickness can be defined by the sheet of material that forms the electrical contacts 404 before the electrical contacts are stamped or otherwise cut from the sheet of material. Each of the retention wings 415 can be curved. For instance, each of the retention wings 415 can be defined by a radius. For instance, each of the retention wings 415 can be defined by a radius of approximately 0.6 mm. Each of the retention wings 415 can define a contact area defined at a location where the retention wing 415 abuts the connector housing 412. The contact area can thus be defined by the thickness of the electrical contact 404 in the longitudinal direction L and a contact height dimension along the transverse direction T, from 0.01 mm to 0.15 mm, of the electrical contact at the retention wings 415 that are in physical contact with the connector housing. For instance, the contact height dimension of each wing 415 can be 0.06 mm. Thus, the contact area can be between 0.001 mm squared and 0.015 mm squared, such as 0.012 mm squared.

One or both of the connector housing 412 and the electrical contact, at the wings 415, can deform when the electrical contacts 404 are mounted in the connector housing 412 to define the contact height dimension. Without being bound by theory, it is believed that the reduction of a cumulative contact area defined by all of the electrical contacts 404 and the connector housing 412 is reduced with respect to conventional electrical connectors, which correspondingly reduces internal forces applied by the electrical contacts 404 to the connector housing 412 that might otherwise cause the connector housing 412 to deform, particularly the inner and outer ends 414e and 414f, during the solder reflow operation. The reduction of internal forces thus allows the connector housing 414 to have a reduced height along the transverse direction T with respect to conventional connector housings 414 while maintaining the planarity of the inner and outer ends 414e and 414f, and further maintaining the co-planarity of the solder balls 422.

Referring now also to FIGS. 7A-7B, each of the electrical contacts 504 can have a contact body 505 that defines a mating end 516 that extends out from that mating interface 506, an opposed mounting end 518 that extends out from the mounting interface 508, and a lead portion 519 that extends between the mating end 516 and the mounting end 518. As described in U.S. Pat. No. 6,042,389, which is incorporated by reference as if set forth in its entirety herein. Each of the electrical contacts 504 can be configured as a plug contact. Thus, the mating end 516 can define a blade that is planar and is oriented to lies within a plane defined by the lateral direction A and the transverse direction T. The mating end 516 can define a distal tip 520 that is inline with the mounting end 518 along the transverse direction T. The mating end 516 can have a dimension in the lateral direction A that is greater than the gap that separates the first and second spring arms 404b and 404c.

Be electrical contacts 504 can further include respective solder balls 522 that project out from the mounting end 518 proximate to the mounting interface 508. The solder balls 522 can be attached or otherwise supported by the mounting ends 518, for instance fused to the mounting end 518, and are configured to be mounted to corresponding electrical contacts, for instance electrically conductive contact pads of the second substrate 30, for instance by positioning the first electrical connector 32 on the second substrate 30 and subjecting the second electrical connector 32 and the second substrate 30 to a solder reflow process whereby the solder balls 522 fuse to the respective contact pads of the second substrate 30. The solder balls 522 can all be co-planar with each other along the mounting interface 508, both before and after the solder reflow process is completed. Thus, all of the solder balls 422 at the mounting ends of first electrical connector 28 are coplanar with each other in a first plane, both before and after the solder balls 422 are reflowed to the first substrate 26 so as to mount the first electrical connector 28 to the first substrate 26. Similarly, all of the solder balls 522 at the mounting ends of the second electrical connector 32 are coplanar with each other in a second plane, both before and after the solder balls 522 are reflowed to the second substrate 30 so as to mount the second electrical connector 32 to the second substrate 30. The first plane can be parallel with the second plane. It should further be appreciated that the electrical contacts 504 are not limited to the illustrated mounting ends 518, and that the mounting ends 518 can be alternatively configured with any other suitable fusible or non-fusible element as desired, such as press-fit mounting tails configured to be inserted into complementary vias of the second substrate 30.

The second electrical connector 32 can define a plurality of pockets 524 that extend into the housing body 514 along the transverse direction T. For instance, the pockets 524 can extend into the outer end 514f of the housing body 514 of the connector housing 512 along the transverse direction T toward the inner end 514e. The mounting ends 518 of the contact body 505 can extend into the pockets 524, such that the solder balls 522 are disposed in respective ones of the pockets 524. Accordingly, the mounting ends of each of the electrical contacts 504, which can include the mounting ends 518 of the contact body 505 and the respective solder ball 522 can be at least partially disposed in the pockets 524. Thus, when the first array 502 of electrical contacts 504 is supported by the connector housing 512, each solder ball 522 is at least partially recessed with respect to the outer end 514f of the housing body 514, in a respective one of the plurality of pockets 524. In this regard, it can be said that the solder balls 522 of the first array 502 of electrical contacts 504 protrude out with respect to the outer end 514f of the housing body 514.

With continuing reference to FIGS. 7A-7B, the connector housing 512 can further define a plurality of retention apertures that extend through the housing body 514 along the transverse direction T from the inner end 514e of the housing body 514 of the connector housing 512 to the outer end 514f of the housing body 514. The retention apertures can include retention cavities 526 that extend into the inner end 514e of the housing body 514 of the connector housing 512 along the transverse direction T, and the plurality of pockets 524 that are substantially aligned with the retention cavities along the transverse direction T. Each of the retention cavities 526 and can be configured to at least partially receive a respective retention portion of the electrical contacts 504, such that when the first array 502 of electrical contacts 504 is supported by the connector housing 512, the mating end 516 of each electrical contact 504 protrudes out with respect to the inner end 514e of the housing body 514. Each retention cavity 526 can be at least partially defined by at least one inner wall 527. Further, each retention cavity 526 can be at least partially defined by a shelf 527a that extends in from the inner walls 527 at a location between the inner end 514e and the outer end 514f. Each shelf 527a can be substantially parallel to the inner end 514e and the outer end 514f. The pockets 524 can be disposed between the shelf 527a and the outer end 514f. The connector housing 512 can define a height H5 along the transverse direction T from the inner end 514e to the outer end 514f from 0.2 mm to 0.6 mm, for instance 0.4 mm. The connector housing 512 can define a height H6 along the transverse direction T from the inner end 514e to the shelf 527a from 0.2 mm to 0.4 mm, for instance instance 0.3 mm.

The electrical contacts 504 can include broadsides 575a and edges 575b as defined above with respect to the electrical contacts 204. The electrical contacts 504 can further include a retention portion that includes at least one retention wing 515, for instance first and second opposed retention wings 515 that project out from opposed sides of the lead portion 519, for instance along the row direction R. Thus, the retention wings 515 that project out from opposed sides of the base 504a in opposite directions along a first direction that separates opposed edges of the electrical contacts 504. The retention wings 515 can extend to a location outboard of one or both of the mating end 516 and the mounting end 518. The retention wings 515 can project out to respective free distal tips 515a that are spaced from each other connector a distance along a select direction that is slightly greater than the cross-sectional dimension of the retention cavity 526 along the select direction. Accordingly, the retention wings 515 can be press-fit against the at least one inner wall 527 so as to retain the electrical contact 504 in the connector housing 512. Accordingly, the retention wings 515 can be press-fit against the at least one inner wall 527 so as to retain the electrical contact 504 in the connector housing 512. Thus, in accordance with one embodiment, the electrical contacts 504 touch the connector housing 512 at only two locations, defined by respective abutments between the retention wings 515 and the at least one inner wall 527. Further, as illustrated in FIG. 7B, the broadsides of the electrical contacts 504 are spaced from the at least one inner wall 527, along a second direction that separates the opposed broadsides, along an entirety of a length between the opposed retention wings 515 along the first direction that separates the opposed edges. Because wicking of solder flux during the solder reflow operation is directed toward contact locations between the contact body 505 and the connector housing 512, the electrical contacts are configured such that any wicking will occur between the retention wings 515 and the connector housing 512, which is offset from a data flow path between the mating end 516 and the mounting end 518. Thus, the data flow path is substantially devoid of wicked solder flux. Furthermore, because the contact body is substantially planar in the cavity 526, the solder is able to substantially fill the pocket 524 during the solder reflow operation. Each electrical contact 504 can define a thickness in the longitudinal direction L of approximately 0.1 mm. Thus, the opposed broadsides of each electrical contact 504 can be spaced from each other a distance of approximately 0.1 mm. The thickness can be defined by the sheet of material that forms the electrical contacts 504 before the electrical contacts are stamped or otherwise cut from the sheet of material. Each of the retention wings 515 can be curved. For instance, each of the retention wings 515 can be defined by a radius. For instance, each of the retention wings 515 can be defined by a radius of approximately 0.6 mm. Each of the retention wings 515 can define a contact area defined at a location where the retention wing 515 abuts the connector housing 512. The contact area can thus be defined by the thickness of the electrical contact 504 in the longitudinal direction L and a contact height dimension along the transverse direction T, from 0.01 mm to 0.15 mm, of the electrical contact at the retention wing 515 that is in physical contact with the connector housing. For instance, the contact height dimension of each wing 415 can be 0.06 mm. Thus, the contact area can be between 0.001 mm squared and 0.015 mm squared, such as 0.012 mm squared. One or both of the connector housing 512 and the electrical contact, at the retention wings 515, can deform when the electrical contacts 504 are mounted in the connector housing 512 to define the contact height dimension. Without being bound by theory, it is believed that the reduction of a cumulative contact area defined by all of the electrical contacts 504 and the connector housing 512 is reduced with respect to conventional electrical connectors, which correspondingly reduces internal forces applied by the electrical contacts 504 to the connector housing 512 that might otherwise cause the connector housing 512 to deform, particularly the inner and outer ends 514e and 514f, during the solder reflow operation. The reduction of internal forces thus allows the connector housing 512 to have a reduced height along the transverse direction T with respect to conventional connector housings 512 while maintaining the planarity of the inner and outer ends 514e and 514f, and further maintaining the co-planarity of the solder balls 522.

Each of the first and second electrical connectors 28 and 32 can include at least one alignment member configured to engage each other so as to ensure that the respective electrical contacts 404 and 504 are aligned to be mated when the first and second electrical connectors 28 and 32 are mated with each other along the mating direction M. Each of the first and second electrical connectors 28 and 32 can further include at least one orientation member orientation member configured to engage each other only when the first and second electrical connectors 28 and 32 are in a predetermined orientation with relative to each other, thereby ensuring the relative orientation when the first and second electrical connectors 28 and 32 are mated to each other. For instance, accordance with one embodiment, the first electrical connector 28 can include at least one recess, such as a first recess 455a and a second recess 455b that extend at least into the connector housing 412, from the inner end 414e toward the outer end 414f, for instance from the inner end 414e to the outer end 414f. The first recess 455a can be disposed at the first side 414a of the connector housing 412, and the second recess 455b can be disposed at the second side 414b of the connector housing 412. The recesses 455a and 455b can define different lengths along the longitudinal direction L.

The second electrical connector 32 can include at least one protrusion such as a first protrusion 555a and a second protrusion 555b that extend out from the inner end 514e along the transverse direction T. The first protrusion 555a can be disposed at the first side 514a and the second protrusion 555b can be disposed at the second side 514b. The first protrusion 555a can defined a length along the longitudinal direction sized to be received in the first recess 455a. The second protrusion 555b can be split so as to defined two second protrusion portions, or can be a single continuous structure, and can define a length along the longitudinal direction L sized to be received in the second recess 455b, and sized greater than that of the first recess 455a. Thus, the first and second electrical connectors 28 and 32 are only able to mate with each other when the first protrusion 555a is aligned with the first recess 455a, and the second protrusion 555b is aligned with the second recess 455b. It should be appreciated that the first and second electrical connectors 28 and 32 can include any suitable alternative alignment member as desired. For instance, the first electrical connector 28 can include one or more projections and the second electrical connector 32 can include one or more recesses.

Referring now also to FIGS. 5A-5B and 8A-8B, the mating ends 516 of the electrical contacts 504 are aligned with the mating ends 416 of the respective electrical contacts 404 so as to be inserted between the respective spring arms 404b and 404c along the column direction C when the first and second electrical connectors 28 and 32 are mated with each other. The spring arms 404b and 404c are elastically flexible and resilient so as to deflect away from each other about the base 404a along the column direction C as the mating ends 416 are inserted therebetween. The resiliency of the spring arms 404b and 404c defines a normal spring force against the mating end 516 that is inserted between the spring arms 404b and 404c. Because the mating ends 516 define a length along the row direction greater than that gap between the adjacent spring arms 404b and 404c, the mating ends 516 define first and second contact locations C1 and C2 with the first and second spring arms 404b and 404c, respectively. The first and second contact locations C1 and C2 can be disposed on opposed sides of the mating ends 516. For instance, the first and second contact locations C1 and C2 can be disposed on opposed broadsides of the electrical contacts 504. Thus, each of the electrical contacts 404 are placed in physical and electrical contact with a respective one of the electrical contacts 504, and each of the electrical contacts 504 are placed in physical and electrical contact with a respective one of the electrical contacts 404. The mating ends 416 of the electrical contacts 404 of the first electrical connector 28 can be configured as receptacle mating ends that are configured to receive complementary mating ends of the electrical contacts 504 of the second electrical connector 32 as described above, so as to mate with the electrical contacts 504. In this regard, the first electrical connector 28 can be referred to as a receptacle electrical connector, and the second electrical connector 32 can be referred to as a header electrical connector. However it should be appreciated that the first and second electrical connectors 28 and 32, respectively, are not limited to the illustrated mating ends, and that the electrical contacts of one or both of the first and second electrical connectors 28 and 32 can be alternatively be configured with any other suitable mating ends as desired. For instance, the electrical contacts of the first electrical connector 28 can be configured as header contacts as described herein with respect to the second electrical connector 32. Further, the electrical contacts of the second electrical connector 32 can be configured as receptacle contacts as described herein with respect to the first electrical connector 28.

When the first and second electrical connectors 28 and 32 are fully mated to each other, the electrical connectors 28 and 32 can combine to define a stack height within a range having a lower end between and including approximately 1 mm and approximately 2 mm, and increments of 0.1 mm therebetween. The range can have an upper end between and including approximately 2 mm and approximately 4 mm, and increments of 0.1 mm therebetween. For instance, the stack height can be approximately 2 mm. The stack height can further be approximately 3 mm. The stack height can be defined by a distance along the transverse direction T between respective locations on the solder balls 422 of the electrical contacts 404 that are spaced furthest from the inner end 414e of the housing body 414 of the connector housing 412 and respective locations on the solder balls 522 of the electrical contacts 504 that are spaced furthest from the inner end 514e of the housing body 514. Otherwise stated, the stack height can be defined by opposed outermost ends, along the transverse direction T, of the solder balls 422 of the first electrical connector 28 and solder balls 522 of the second electrical connector 32. While the first electrical connector 28 can be mounted to the first substrate 26 and the second electrical connector 32 can be mounted to the second substrate 30 as illustrated in FIG. 1, it should be appreciated that the second electrical connector 32 can alternatively be mounted to the first substrate 26 and the first electrical connector 28 can alternatively be mounted to the second substrate 30.

The foregoing description is provided for the purpose of explanation and is not to be construed as limiting the invention. While various embodiments have been described with reference to preferred embodiments or preferred methods, it is understood that the words which have been used herein are words of description and illustration, rather than words of limitation. Furthermore, although the embodiments have been described herein with reference to particular structure, methods, and embodiments, the invention is not intended to be limited to the particulars disclosed herein. For instance, it should be appreciated that structure and methods described in association with one embodiment are equally applicable to all other embodiments described herein unless otherwise indicated. Those skilled in the relevant art, having the benefit of the teachings of this specification, may effect numerous modifications to the invention as described herein, and changes may be made without departing from the spirit and scope of the invention, for instance as set forth by the appended claims.

The invention claimed is:

1. A separator configured to separate first and second electrical sub-assemblies that include first and second substrates, respectively, and respective pluralities of first and second electrical connectors that are mounted to the first and second substrates, respectively, and mated to each other, the separator comprising:

a first separation member having at least one first separation post that is sized and configured extend through an aperture that extends through the first printed circuit board; and a second separation member having at least one second separation post that is sized and configured to extend through a second aperture that extends through a second printed circuit board of the second electrical subassembly, such that the first separation post is in mechanical communication with the second substrate, and the second separation post is in mechanical communication with the first substrate, wherein when the first separation post extends through the first aperture and is in mechanical communication with the second substrate, and the second separation post extends through the second aperture and is in mechanical communication with the first substrate, at least one of the first and second separation members is configured to receive a compressive force toward another one of the first and second separation members sufficient to cause the first and second substrates to separate from each other.

2. The separator as recited in claim 1, wherein the first separation member comprises a first base, such that the at least one first separation post extends out from a first surface of the first base.

3. The separator as recited in claim 2, wherein the second separation member comprises a second base, such that the at least one second separation post extends out from a first surface of the second base.

4. The separator as recited in claim 3, wherein each of the first and second bases define respective outer perimeters, and when the outer perimeters are aligned with each other and the first surfaces of the first and second bases face each other and are spaced from each other along a transverse direction, the at least one first post is spaced from the at least one second post along a direction perpendicular to the transverse direction.

5. The separator as recited in claim 4, wherein the first separation member comprises a plurality of first separation posts that extend from the first base, the second separation member comprises a plurality of second separation posts that extend from the second base, and each of the first and second separation posts is configured to extend through a respective one of a plurality of apertures that extend through the first and second substrates, respectively.

6. The separator as recited in claim 5, wherein the first separation posts extend out from the first base along a direction normal to the first base, and the second separation posts extend out from the second base along a direction normal to the second base.

7. The separator as recited in claim 5, wherein the first separation posts all have a same height as measured from the first base to respective tips of the first separation posts, and the second separation posts all have a same height as measured from the second base to respective tips of the second separation posts.

8. The separator as recited in claim 5, wherein the first separation posts are equidistantly spaced along the first base, and the second separation posts are equidistantly spaced along the second base.

9. The separator as recited in claim 5, wherein the first and second bases are oriented parallel to each other when the first and second separation members are coupled to the first and second substrates, respectively.

10. The separator as recited in claim 5, wherein the first and second separation posts are oriented parallel to each other when the first and second separation members are coupled to the first and second substrates, respectively.

11. The separator as recited in claim 5, wherein when the first and second pluralities of separation posts extend through the first and second substrates, respectively, a plane normal to the transverse direction extends through each of the pluralities of first and second separation posts, and each of the first separation posts is spaced from each of the second separation posts along the plane.

12. The separator as recited in claim 5, wherein the separator is configured such that when the first surfaces of the first and second bases face each other and respective outer perimeters of the first and second bases are aligned with each other along the transverse direction, none of the first separation posts are aligned with any of the second separation posts along the transverse direction.

13. An electrical system, comprising the separator and the first and second electrical subassemblies as recited in claim 1.

14. An electrical system comprising:
a first electrical sub-assembly including:
a first substrate that defines a first surface and a second surface opposite the first surface, wherein a plurality of first apertures extend through the first substrate from the first surface to the second surface; and
a plurality of first electrical connectors mounted to the first substrate, such that the first electrical connectors extend out from the first surface of the first substrate at respective footprints, wherein each of the first apertures is disposed outside each of the footprints;
a second electrical sub-assembly including:
a second substrate that defines a first surface and a second surface opposite the first surface; and
a plurality of second electrical connectors mounted to the second substrate, such that the second electrical connectors extend out from the first surface of the second substrate at respective footprints of the second substrate, wherein the second substrate comprises a plurality of second apertures disposed outside each of the footprints of the second substrate; and a first separation member including a first base and a plurality of first separation posts that extend out from the first base a first distance, wherein each of the first separation posts is sized to extend through a respective one of the first apertures; and
wherein when the first and second electrical connectors are mated to each other along a transverse direction, the second surface of the first substrate is spaced from the first surface of the second substrate a distance along the transverse direction that is less than the first distance.

15. The electrical system as recited in claim 14, wherein the plurality of second apertures extend through the second substrate from the first surface to the second surface, the electrical system further comprising:
a second separation member including a second base and a plurality of second separation posts that extend out from the second base a second distance,
wherein when the first and second electrical connectors are mated to each other along the transverse direction, the second surface of the second substrate is spaced from the first surface of the first substrate a distance along the transverse direction that is less than the second distance.

16. The electrical assembly as recited in claim 15, wherein the first and second bases are oriented parallel to each other when the first separation posts extend through the first apertures and the second separation posts extend through the second apertures.

17. The electrical assembly as recited in claim 15, wherein each of the first separation posts is spaced from all of the second separation posts along a plane that is normal to the transverse direction when the first separation posts extend through the first apertures and the second separation posts extend through the second apertures.

18. The electrical assembly as recited in claim 15, wherein when the first electrical sub-assembly is mated to the second electrical sub-assembly, none of the first separation posts are aligned with any of the second electrical connectors when the first separation posts extend through the first apertures, and none of the second separation posts are aligned with any of the first electrical connectors when the second separation posts extend through the second apertures.

19. The electrical assembly as recited in claim 15, wherein each of the first separation posts extends from the first base to a same first height, and each of the second separation posts extends from the second base to a same second height.

20. The electrical assembly as recited in claim 15, wherein the first height is equal to the second height.

21. A method of unmating a first plurality of electrical connectors that are mounted onto a first substrate from a second plurality of electrical connectors that are mounted onto a second substrate, the method comprising the steps of:
    inserting a plurality of first separation posts through respective first apertures that extend through the first substrate in a direction toward the second substrate, wherein the first separation posts extend from a first base,
    placing the first separation posts in mechanical communication with the second substrate, and
    applying a separation force to the first base in a direction toward the first substrate, thereby causing the first separation posts to urge the second substrate away from the first substrate so as to unmate the first electrical connectors from the second electrical connectors.

22. The method as recited in claim 21, wherein the placing step creates a first gap between the first base and the first substrate, and the applying step closes the first gap.

23. The method as recited in claim 22, wherein the applying step causes the first base to abut the first substrate.

24. The method as recited in claim 21, wherein the placing step places respective tips of the first separation posts in contact with the second substrate.

25. The method as recited in claim 21, further comprising the steps of:
    inserting a plurality of second separation posts through respective second apertures that extend through the second substrate in a direction toward the first substrate, wherein the second separation posts extend from a second base;
    placing the second separation posts in mechanical communication with the first substrate; and
    bracing the second base against the separation force during the applying step.

26. The method as recited in claim 25, wherein the step of placing the second separation posts creates a second gap between the second base and the first substrate, and the bracing step closes the second gap.

27. The method as recited in claim 26, wherein the bracing step causes the second base to abut the second substrate.

28. The method as recited in claim 25, wherein the step of placing the second separation posts places respective tips of the second separation posts in contact with the first substrate.

* * * * *